United States Patent
Horibe et al.

(10) Patent No.: US 12,094,825 B2
(45) Date of Patent: Sep. 17, 2024

(54) INTERCONNECTION BETWEEN CHIPS BY BRIDGE CHIP

(71) Applicant: INTERNATIONAL BUSINESS MACHINES CORPORATION, Armonk, NY (US)

(72) Inventors: Akihiro Horibe, Yokohama (JP); Toyohiro Aoki, Yokohama (JP); Takashi Hisada, Hachiouji (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 18/344,418

(22) Filed: Jun. 29, 2023

(65) Prior Publication Data
US 2023/0343713 A1    Oct. 26, 2023

Related U.S. Application Data

(62) Division of application No. 17/445,161, filed on Aug. 16, 2021, now Pat. No. 11,848,272.

(51) Int. Cl.
*H01L 23/538*    (2006.01)
*H01L 21/56*    (2006.01)
(Continued)

(52) U.S. Cl.
CPC ........ *H01L 23/5381* (2013.01); *H01L 21/568* (2013.01); *H01L 23/13* (2013.01); *H01L 24/14* (2013.01); *H01L 24/98* (2013.01); *H01L 25/0655* (2013.01); *H01L 25/50* (2013.01); *H01L 24/73* (2013.01); *H01L 24/92* (2013.01); *H01L 25/18* (2013.01);
(Continued)

(58) Field of Classification Search
CPC .... H01L 23/5381; H01L 21/568; H01L 23/13
See application file for complete search history.

(56) References Cited

U.S. PATENT DOCUMENTS 9,148,966 B2    9/2015    Tachikawa et al.
10,483,156 B2    11/2019    Leobandung
(Continued)

FOREIGN PATENT DOCUMENTS

WO    2023021378 A1    2/2023

OTHER PUBLICATIONS

Intel, "Embedded Multi-Die Interconnect Bridge," https://www.intel.com/content/www/us/en/silicon-innovations/6-pillars/emib.html, printed Mar. 11, 2021, 6 pgs.
(Continued)

*Primary Examiner* — Errol V Fernandes
(74) *Attorney, Agent, or Firm* — Yee & Associates, P.C.

(57) ABSTRACT

A method of fabricating a bridged multi-chip assembly structure includes providing a carrier substrate. The method further includes arranging a plurality of chips on the carrier substrate in a predetermined layout. Each chip has a front surface including a set of terminals formed thereon. The method further includes depositing a molding material between the plurality of chips and on the carrier substrate. The method further includes removing the carrier substrate from the plurality of chips fixed by the molding material. The method further includes bonding a bridge chip to corresponding sets of terminals of at least two chips of the plurality of chips fixed by the molding material.

25 Claims, 11 Drawing Sheets

(51) Int. Cl.
  *H01L 23/00* (2006.01)
  *H01L 23/13* (2006.01)
  *H01L 25/00* (2006.01)
  *H01L 25/065* (2023.01)
  *H01L 25/18* (2023.01)

(52) U.S. Cl.
  CPC .............. *H01L 2224/1403* (2013.01); *H01L 2224/16145* (2013.01); *H01L 2224/16227* (2013.01); *H01L 2224/73204* (2013.01); *H01L 2224/92125* (2013.01); *H01L 2924/1515* (2013.01); *H01L 2924/18161* (2013.01)

(56) References Cited

U.S. PATENT DOCUMENTS

| | | | |
|---|---|---|---|
| 10,892,219 | B2 | 1/2021 | Pietambaram et al. |
| 2010/0001396 | A1* | 1/2010 | Meyer .................... H01L 24/96 257/E23.001 |
| 2011/0233764 | A1 | 9/2011 | Chang et al. |
| 2013/0168854 | A1 | 7/2013 | Karikalan et al. |
| 2014/0131854 | A1 | 5/2014 | Hawk et al. |
| 2015/0116965 | A1 | 4/2015 | Kim et al. |
| 2018/0197776 | A1 | 7/2018 | Ban |
| 2019/0295952 | A1 | 9/2019 | Sikka et al. |
| 2019/0312019 | A1 | 10/2019 | Pietambaram et al. |
| 2020/0035603 | A1 | 1/2020 | Rubin et al. |
| 2020/0075546 | A1* | 3/2020 | Shih .................... H01L 25/50 |
| 2021/0134724 | A1 | 5/2021 | Rubin et al. |
| 2021/0134728 | A1 | 5/2021 | Rubin |
| 2021/0159211 | A1 | 5/2021 | Rubin |
| 2022/0302065 | A1* | 9/2022 | Cho .................... H01L 23/295 |
| 2023/0051337 | A1 | 2/2023 | Horibe |

OTHER PUBLICATIONS

International Search Report and Written Opinion, International Application No. PCT/IB2022/057503, Nov. 28, 2022, 8 pgs.
Office Action dated Mar. 16, 2023, Application No. 111115944, filed Apr. 27, 2022, 9 pgs.
Wu, B. "Ceramic Interconnect Bridge for Heterogeneous Multiple Chip Packaging," https://ieeexplore.ieee.org/abstract/document/8394004, pp. 1-3, May 2018.
List of IBM Patents or Patent Applications Treated as Related, Jun. 27, 2023, 2 pgs.
Horibe, et al., "Interconnection Between Chips By Bridge Chip," TW Application No. 111115944, filed Apr. 27, 2022.

* cited by examiner

INTERCONNECTION BETWEEN CHIPS BY BRIDGE CHIP

BACKGROUND

The present disclosure, generally, relates to multi-chip interconnection technology, and more particularly, to a method for fabricating a bridged multi-chip assembly structure and a bridged multi-chip assembly structure fabricated by the method.

Current computing technology requires high-density interconnections between multiple chips, such as between a Central Processing Unit (CPU) and a memory and between an Artificial Intelligence (AI) accelerator and a memory. One structure for interconnecting the multiple chips is a bridge structure, wherein multiple chips are connected by a bridge chip that implements high-density interconnections.

An Embedded Multi-die Interconnect Bridge (EMIB) structure, wherein a small silicon die is embedded into an organic substrate under the edges of two interconnecting dies, has been used as a structure for interconnecting a plurality of chips. However, such structures have assembly issues. For example, mechanical stresses around the joints between the chip and the bridge die are relatively large due to differences in the coefficients of thermal expansion between the chips and the organic substrate. Such mechanical stresses may cause failure during the bonding process between chips and the organic substrate, which degrades the yield of the packaging products. Therefore, it is desirable to develop a novel multi-chip interconnection technique capable of connecting a plurality of chips by a bridge chip while relieving mechanical stresses generated around joints between the chip and the bridge chip.

SUMMARY

According to an embodiment of the present disclosure, a method of fabricating a bridged multi-chip assembly structure is provided. The method includes providing a carrier substrate. The method further includes arranging a plurality of chips on the carrier substrate in a predetermined layout. Each chip has a front surface including a set of terminals formed thereon. The method further includes depositing a molding material between the plurality of chips and on the carrier substrate. The method further includes removing the carrier substrate from the plurality of chips fixed by the molding material. The method further includes bonding a bridge chip to corresponding sets of terminals of at least two chips of the plurality of chips fixed by the molding material.

The method according to the embodiment of the present disclosure enables fabrication of a bridged multi-chip assembly structure connecting a plurality of chips by a bridge chip while relieving stress generated around joints between the chip and the bridge chip by rigidly fixing the plurality of chips.

In accordance with at least one embodiment, the front surface of each chip may include a set of bumps for connecting to an organic substrate. The plurality of chips may be arranged on the layer of the carrier substrate such that the front surface of each chip faces the carrier substrate. Providing the carrier substrate may include preparing a carrier substrate, applying a resin material on the carrier substrate, and patterning the resin material to give the layer of the carrier substrate having a space where the set of bumps of each chip is accommodated when arranging the plurality of chips and depositing the molding material.

In such embodiments, the front surfaces of the chips are protected from being buried in the molding material and the sets of bumps are prevented from being deformed even if the sets of bumps are formed onto the chips before the arrangement of the chips and the deposition of the molding material.

In accordance with at least one embodiment, the method may further include forming sets of bumps, for connecting to an organic substrate, on front surfaces of the plurality of chips fixed by the molding material. In such embodiments, the layer of the carrier substrate may be an adhesive layer.

In accordance with at least one embodiment, the front surface of each chip may include a set of bumps for connecting to an organic substrate. The distance between a back surface of the bridge chip and a plane of front surfaces of the plurality of chips or the sum of the bridge chip thickness and the height of the joints between the chip and bridge chip may be less than a height of the bumps. In such embodiments, this eliminates the need to form a recess, cavity, or trench in the organic substrate to avoid interference between the bridge chip and the organic substrate, which reduces a fabrication cost.

In accordance with at least one embodiment, placing the bridge chip may include forming joints between the two or more of the plurality of chips and the bridge chip via the corresponding sets of terminals. Placing the bridge chip may further include applying an underfill material at least positions corresponding to the joints between the bridge chip and the two or more of the plurality of chips. In such embodiments, the two or more of the plurality of chips and the bridge chip are further firmly fixed to each other before bonding to the organic substrate.

In accordance with at least one embodiment, depositing the molding material may include depositing the molding material into at least a gap between the plurality of chips such that a back surface of each chip is exposed. In such embodiments, the resulting structure is suitable for high performance chips since the exposed back surfaces of the chips can be used for heat removal (e.g., by attaching a heat sink to the back surface of the chip).

In accordance with at least one embodiment, depositing the molding material may include depositing the molding material between and over the plurality of chips. Depositing the molding material may further include thinning at least the molding material from a back side of the chips such that a pre-molded multi-chip structure containing the plurality of chips and a part of the molding material has a uniform thickness. In such embodiments, variations and/or deviations in chip thickness can be accommodated.

In accordance with at least one embodiment, the carrier substrate may have a wafer or a panel form, and depositing the molding material may result in a wafer or panel shaped structure containing the plurality of chips and a part of the molding material. The method may further include dicing the wafer or panel shaped structure to obtain a piece of a bridged multi-chip assembly. In such embodiments, since wafer level fabrication processes can be utilized, the accuracy of alignments between the chips and between each chip and the bridge chip and the throughput of the fabrication can be improved.

In accordance with at least one embodiment, the front surface of each chip may include a set of bumps for connecting to an organic substrate and the carrier substrate may include an array of micro-pads on which each chip is to be arranged. Arranging the plurality of chips may include temporarily fixing the set of bumps and the array of micro-pads. Removing the carrier substrate and the layer from the plurality of chips may include debonding the array of micro-pads from the set of bumps. In such embodiments, the plurality of chips can be firmly adhered to the carrier substrate during the deposition of the molding material.

According to another embodiment of the present disclosure, a bridged multi-chip assembly structure is provided. The bridged multi-chip assembly structure includes a plurality of chips arranged in a predetermined layout. Each of the chips has a front surface including a set of terminals. The bridged multi-chip assembly structure further includes a molding material fixing the plurality of chips and exposing the front surface of each chip. The bridged multi-chip assembly structure further includes a bridge chip connecting at least two chips of the plurality of chips via corresponding sets of terminals.

In such embodiments, the entire front surface of each chip is not covered by the molding material. In such embodiments, the bridged multi-chip assembly structure is capable of relieving stress generated around joints between the chip and the bridge chip during its fabrication process. Accordingly, its manufacturing yield is able to be improved.

In accordance with at least one embodiment, the front surface of each chip may further include a set of joints (i.e., chip-substrate joints) connecting to an organic substrate. The distance between a back surface of the bridge chip and a plane of front surfaces of the plurality of chips or the sum of the bridge chip thickness and the height of joints (i.e., chip-bridge joints) between the chip and bridge chip may be less than a height of the joints (i.e., chip-substrate joints). In such embodiments, this eliminates the need to form a recess, cavity, or trench on the organic substrate for avoiding interference with the bridge chip, thereby reducing the cost of fabrication.

According to another embodiment of the present disclosure, a method of fabricating a multi-chip assembly structure is disclosed. The method includes providing a carrier substrate. The method further includes arranging a plurality of chips on the carrier substrate. Each chip has a front surface including a set of terminals formed thereon. Each chip has a back surface opposite the front surface. The chips of the plurality of chips have a uniform chip thickness between respective front surfaces and back surfaces. The method further includes placing a mold in close contact with the back surfaces of the plurality of chips. The method further includes depositing a molding material such that the molding material is in contact with the mold, between the plurality of chips, and on the carrier substrate. The method further includes removing the carrier substrate from the plurality of chips fixed by the molding material.

In such embodiments, a mold can be used to facilitate depositing the molding material, which may be a simpler and more efficient way to deposit the molding material in the desired arrangement. In such embodiments, the back surfaces of chips having substantially uniform chip thickness (as used herein, chips having substantially uniform chip thickness may have discrepancies in chip thickness that are negligible and/or do not impact the resulting structure) may be easily exposed by simply removing the mold.

According to another embodiment of the present disclosure, a method of fabricating a multi-chip assembly structure is disclosed. The method includes providing a carrier substrate. The method further includes arranging a plurality of chips on the carrier substrate. Each chip has a front surface including a set of terminals formed thereon. Each chip has a back surface opposite the front surface. The chips of the plurality of chips have different chip thicknesses between respective front surfaces and back surfaces. The method further includes arranging a mold spaced apart from the back surfaces of the plurality of chips. The method further includes depositing a molding material such that the molding material is in contact with the mold, between the plurality of chips, and on the carrier substrate. The method further includes removing the carrier substrate from the plurality of chips fixed by the molding material.

In such embodiments, a mold can be used to facilitate depositing the molding material, which may be a simpler and more efficient way to deposit the molding material in the desired arrangement. In such embodiments, the back surfaces of chips having discrepancies in chip thickness that are not negligible and/or would impact the resulting structure may be easily exposed by removing the mold and removing material until the desired back surfaces are exposed. Accordingly, in such embodiments, discrepancies in chip thickness can be accommodated.

According to another embodiment of the present disclosure, a method of fabricating a multi-chip assembly structure is disclosed. The method includes providing a carrier substrate having a surface. The carrier substrate includes a release layer arranged in direct contact with the surface and includes a patterned layer arranged in direct contact with the release layer. The method further includes arranging a plurality of chips on the layer of the carrier substrate. Each chip has a front surface including a set of terminals formed thereon. The method further includes depositing a molding material between the plurality of chips and on the patterned layer of the carrier substrate. The method further includes removing the carrier substrate and the release layer from the plurality of chips fixed by the molding material.

In such embodiments, the method does not require the use of molds, which may be advantageous in particular circumstances by providing flexibility in the deposition of molding material. More specifically, in such embodiments, it is possible to deposit the molding material in a manner such that only the gaps between adjacent chips are filled while spaces around the chips are not filled with the molding material.

The above summary is not intended to describe each illustrated embodiment or every implementation of the present disclosure. Additional features and advantages are realized through the techniques of the present disclosure. Other embodiments and aspects of the disclosure are described in detail herein and are considered a part of the claimed disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure. Note that the sizes and relative positions of elements and layers in the drawings are not necessarily drawn to scale.

FIG. 10A illustrates an example of a component following the performance of a portion of a process for manufacturing a bridged multi-chip assembly structure, in accordance with embodiments of the present disclosure.

FIG. 10B illustrates an example of a component following the performance of a portion of a process for manufacturing a bridged multi-chip assembly structure, in accordance with embodiments of the present disclosure.

FIG. 10C illustrates an example of a component following the performance of a portion of a process for manufacturing a bridged multi-chip assembly structure, in accordance with embodiments of the present disclosure.

FIG. 10D illustrates an example of a component following the performance of a portion of a process for manufacturing a bridged multi-chip assembly structure, in accordance with embodiments of the present disclosure.

FIG. 10E illustrates an example of a component following the performance of a portion of a process for manufacturing a bridged multi-chip assembly structure, in accordance with embodiments of the present disclosure.

FIG. 10F illustrates an example of a component following the performance of a portion of a process for manufacturing a bridged multi-chip assembly structure, in accordance with embodiments of the present disclosure.

FIG. 10G illustrates an example of a component following the performance of a portion of a process for manufacturing a bridged multi-chip assembly structure, in accordance with embodiments of the present disclosure.

DETAILED DESCRIPTION

Hereinafter, the present disclosure will be described with respect to particular embodiments, but it will be understood by those skilled in the art that the embodiments described below are mentioned only by way of examples and are not intended to limit the scope of the present disclosure.

One or more embodiments according to the present disclosure are directed to a method of fabricating a bridged multi-chip assembly structure interconnecting a plurality of chips by a bridge chip and the bridged multi-chip assembly structure fabricated by the method.

Each chip to be bridged has a first surface including a set of terminals formed thereon and a second surface opposite to the first surface. The set of terminals of each chip is used for bridging. The first surface where the set of terminals for bridging is formed may also be referred to as a "front surface," and the second surface opposite to the front surface may also be referred to as a "back surface." In a particular embodiment, the front surface of each chip also includes a set of bumps used for connecting to an organic substrate. The terminals may have any suitable form. In a particular embodiment, the set of terminals for bridging is a set of contact pads with or without a pre-solder.

Figure 1:
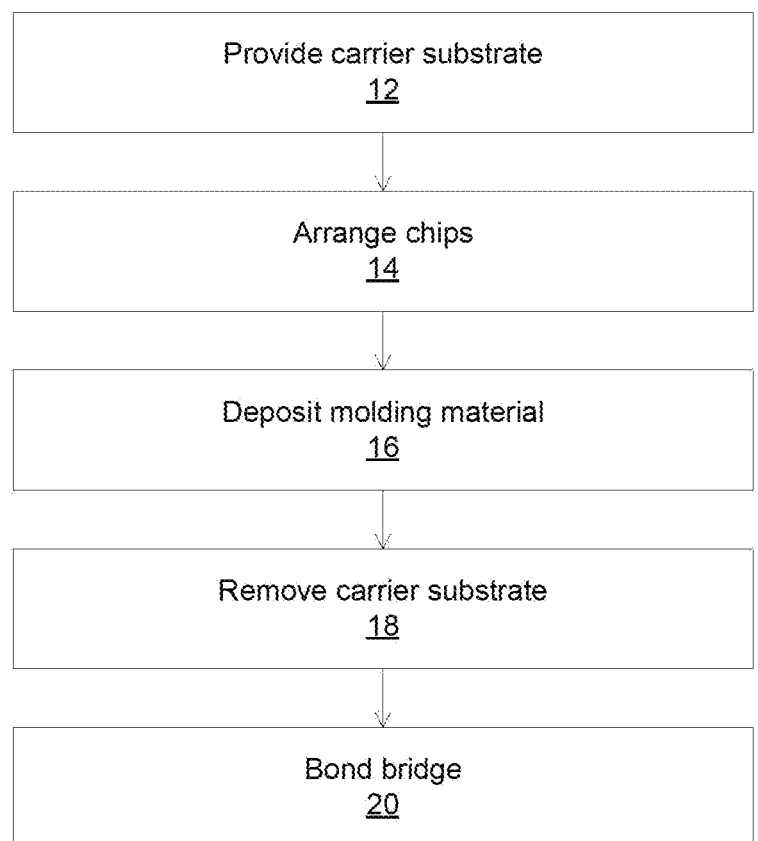
FIG. 1 illustrates a flowchart of an example method of fabricating a bridged multi-chip assembly structure interconnecting a plurality of chips by a bridge chip, in accordance with embodiments of the present disclosure.

FIG. 1 illustrates a flowchart of an example method 10 of fabricating a bridged multi-chip assembly structure interconnecting a plurality of chips by a bridge chip, in accordance with embodiments of the present disclosure. The method 10 includes providing a carrier substrate having a layer at operation 12. The method 10 further includes arranging a plurality of chips on the layer of the carrier substrate in a predetermined layout at operation 14. The method 10 further includes depositing a molding material between the plurality of chips and on the layer of the carrier substrate at operation 16. The method 10 further includes removing the carrier substrate and the layer from the plurality of chips fixed by the molding material at operation 18. The method 10 further includes bonding a bridge chip to two or more of the plurality of chips fixed by the molding material via corresponding sets of terminals at operation 20.

With reference to FIGS. 2A-2B and FIGS. 3A-3B, a schematic of a bridged multi-chip assembly structure according to an example embodiment of the present disclosure is described.

Figure 2A:
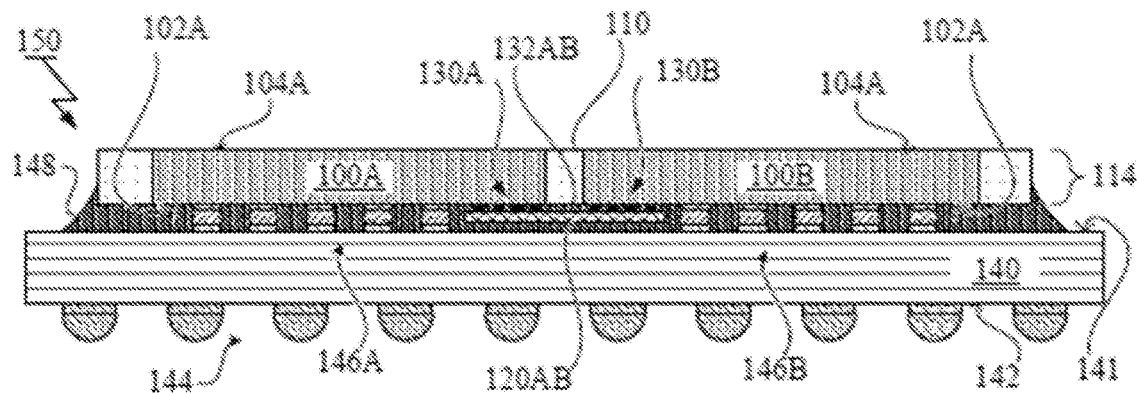
FIG. 2A illustrates a schematic cross-sectional view of a bridged multi-chip assembly structure after bonding to an organic substrate, in accordance with embodiments of the present disclosure.
Figure 2B:
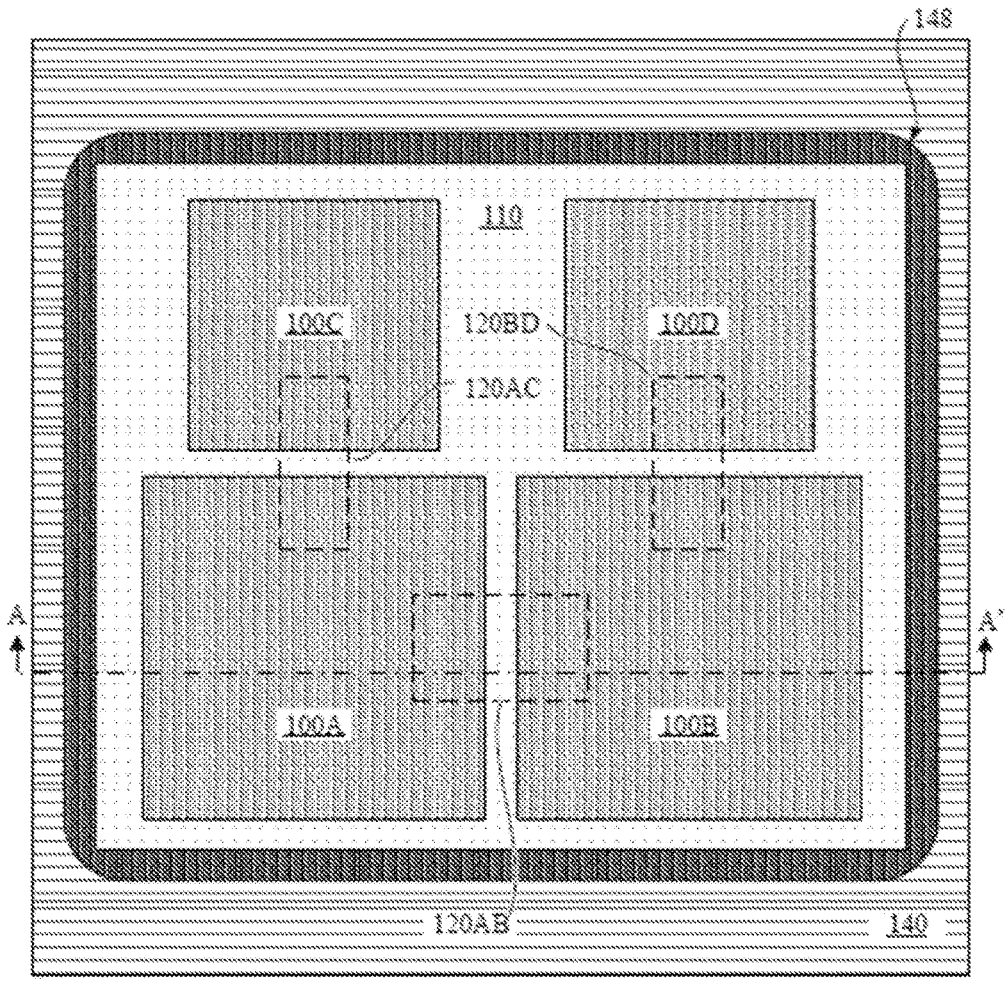
FIG. 2B illustrates a schematic top view of a bridged multi-chip assembly structure after bonding to an organic substrate, in accordance with embodiments of the present disclosure.
Figure 3A:
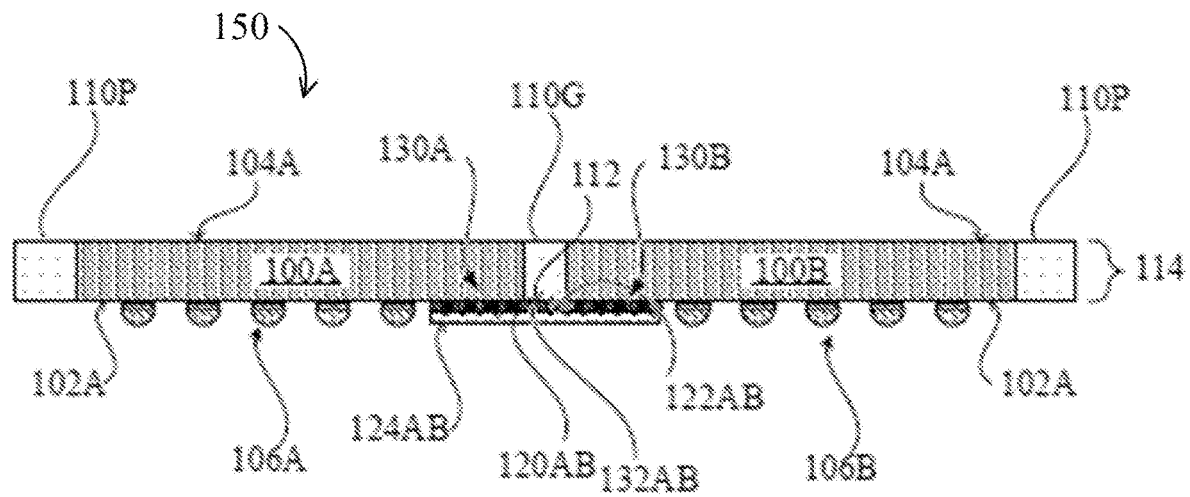
FIG. 3A illustrates a schematic cross-sectional view of a bridged multi-chip assembly structure before bonding to an organic substrate, in accordance with embodiments of the present disclosure.
Figure 3B:
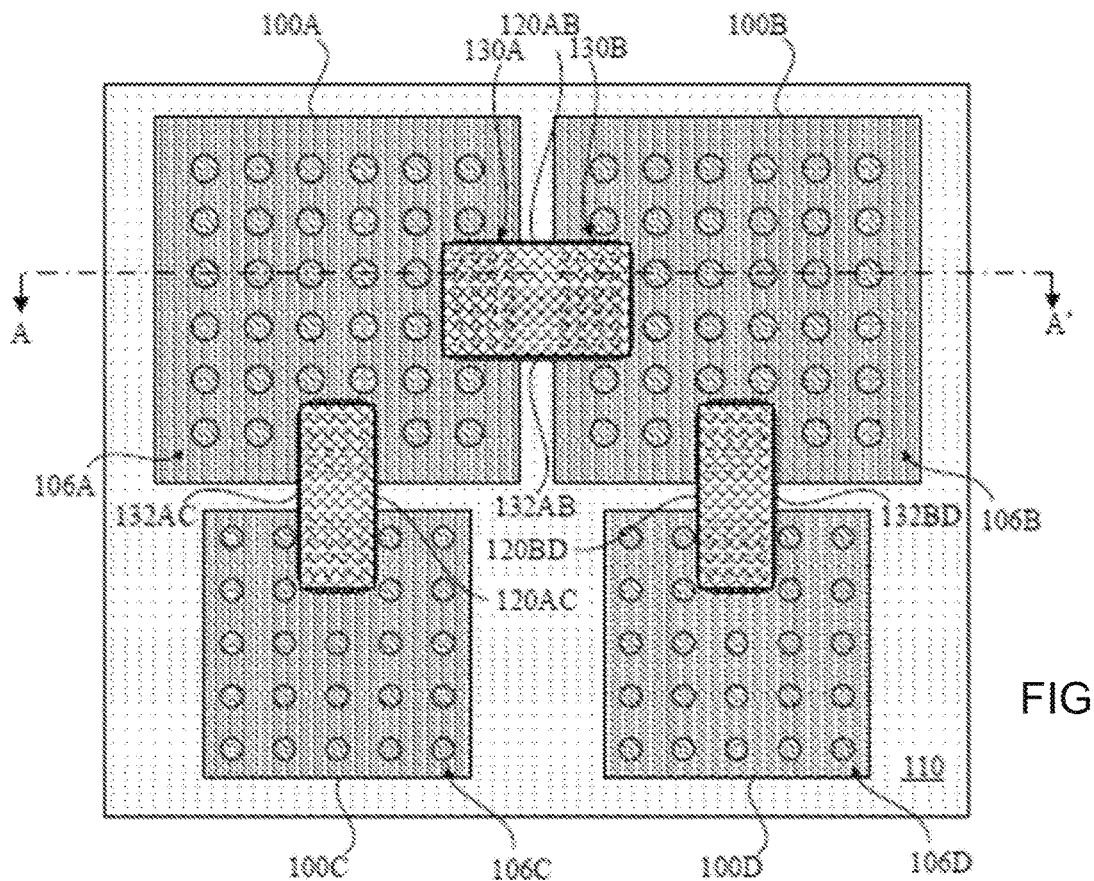
FIG. 3B illustrates a schematic top view of a bridged multi-chip assembly structure before bonding to an organic substrate, in accordance with embodiments of the present disclosure.

FIGS. 2A-2B show a bridged multi-chip assembly structure 150 including four chips 100A-100D bonded to an organic substrate 140. FIGS. 3A-3B show a bridged multi-chip assembly structure 150 before bonding to the organic substrate 140. The bridged multi-chip assembly structures 150 shown in FIGS. 2A-2B and FIGS. 3A-3B include interconnection structures for interconnecting four chips 100A-100D by three bridge chips 120AB, 120AC, and 120BD. However, this is merely an example. The number of chips to be interconnected is not limited, and the number of bridge chips to be used to interconnect the chips is also not limited. In a particular example, the structure including four chips bridged by a single bridge chip that overlaps with respective corners of the four chips may also be contemplated. In general, the bridged multi-chip assembly structure according to embodiments of the present disclosure is a structure interconnecting two or more chips by one or more bridge chips.

The chips 100A-100D may be referred to collectively as chips 100. Each of the chips 100A-100D may simply be referred to as a chip 100, without a corresponding letter, when identification of a particular chip is not relevant. Similarly, the bridge chips 120AB, 120AC, and 120BD may be referred to collectively as bridge chips 120. Each of the bridge chips may simply be referred to as a bridge chip 120, without a corresponding letter, when identification of a particular bridge chip is not relevant.

FIG. 2A and FIG. 3A show cross-sectional views of the bridged multi-chip assembly structure 150 after and before bonding to the organic substrate 140, respectively. FIG. 2B shows a top view of the bridged multi-chip assembly structure 150 after bonding to the organic substrate 140. FIG. 3B shows a bottom view of the bridged multi-chip assembly structure 150 before bonding to the organic substrate 140. Note that cross-sectional views shown in FIG. 2A and FIG. 3A correspond to the cross-sections denoted by one-dot chain lines A-A' shown in the top and bottom views of FIG. 2B and FIG. 3B, respectively.

The bridged multi-chip assembly structure 150 shown in FIGS. 2A and 2B includes four chips 100A, 100B, 100C, and 100D and three bridge chips 120AB, 120AC, and 120BD. Each bridge chip 120 overlaps with two of the chips 100A-100D and connects them. For instance, the bridge chip 120AB connects the two adjacent chips 100A, 100B via corresponding chip-bridge joints 130A, 130B. The bridge chip 120AC connects the two adjacent chips 100A, 100C, and the bridge chip 120BD connects other two adjacent chips 100B, 100D. In the bridged multi-chip assembly structure 150 shown in FIGS. 2A-2B and FIGS. 3A-3B, the chip 100A is connected to the adjacent chip 100C by the bridge chip 120AC, the chip 100B is connected to the adjacent chip 100D by the bridge chip 120BD, and the chip 100A and the chip 100B are connected to each other by the bridge chip 120AB. However, the connection form among the plurality of chips 100 is not limited and any connection form may be contemplated.

Each chip 100 has a front surface 102A and a back surface 104A. The four chips 100A-100D are bound to the organic substrate 140 upside down (e.g., with the front surface down) as shown in FIG. 2A. The four chips 100A-100D are arranged in a predetermined layout as shown in FIG. 2B. Each bridge chip 120 is arranged on the front surfaces 102 of the two adjacent chips 100.

Each chip 100 may include, but is not limited to, a semiconductor chip (also referred to as a "die") containing an integrated circuit. The integrated circuit of each chip 100 may include electric, electro-optic, and/or electro-magnetic elements fabricated therein and wirings for connecting these elements to terminals formed at the front surface 102A of the chip 100. Each chip 100 may have one or more functionalities of a processor, such as a central processing unit (CPU), a digital signal processer (DSP), a General-Purpose Computing on Graphics Processing Units (GPGPU), a memory, an AI accelerator, a System-on-a-chip (SoC), etc. Each chip 100 may be made of a semiconductor material such as, for example, Si, SiGe, Ge, GaAs, GaP, InSb, or another semiconductor material with similar relevant properties. Such semiconductor chip generally has low Coefficient of Thermal Expansion (CTE).

In the embodiment shown in FIGS. 2A and 2B and FIGS. 3A and 3B, the bridged multi-chip assembly structure 150 is a heterogeneous integrated package wherein at least two chips having different functions are integrated into one package. However, in other embodiment, the bridged multi-chip assembly structure 150 may be a homogeneous integrated package wherein a plurality of chips having the same function is integrated into one package. Also, in further other embodiments, the bridged multi-chip assembly structure 150 may be a semi-finished product of such a homogeneous or heterogeneous integrated package.

The front surface 102 includes a set of terminals for bridging (note that the set of chip-bridge joints 130 is already formed on the set of terminals of each chip 100 in FIGS. 2A and 2B) and a set of bumps for connecting to the organic substrate 140 (note that a set of chip-substrate joints 146 is already formed by using the set of bumps of each chip 100 in FIGS. 2A and 2B). The terminals may have any suitable form, including a pad (with or without pre-solder), a bump, etc. The bumps for connecting to the organic substrate 140 may be Controlled Collapse Chip Connection (C4) solder bumps.

The plurality of chips 100 is surrounded by an extension part 110 that is made of a molding material and fixes rigidly the chips 100 to each other by the molding material. The extension part 110 is formed between every pair of adjacent chips 100 and around the plurality of chips 100. In the described embodiment, as shown in FIGS. 2A and 2B and FIGS. 3A and 3B, the plurality of chips 100 are embedded into the extension part 110 so as to give a single chip-shaped form. The extension part 110 extends areas of the front surfaces 102 of the chips 100. As shown in FIG. 3A, a portion of the extension part 110 filled into a gap between the chips 100 is referred to as a gap part 110G, whereas a portion of the extension part 110 filled around the plurality of chips 100 is referred to as a peripheral part 110P. A structure 114 containing the plurality of chips 100 and the extension part 110 surrounding the plurality of chips 100 is called a pre-molded multi-chip structure. The thickness of the pre-molded multi-chip structure 114 may preferably be substantially uniform.

The extension part 110 is made of a molding material, which may include, but is not limited to, a thermosetting resin, a thermoplastic resin, or a composite compound. In a particular embodiment, an epoxy-based resin material containing epoxy resin as a primary component may be preferably used. The molding material may also include filler in addition to the resin material for rigidly fixing the plurality of chips 100 to each other.

In the described embodiment, the back surfaces 104 of the chips 100 are exposed from the molding material. Such structure where the back surfaces 104 of the chips 100 are exposed from the molding material (further, exposed from the package) is suitable for high performance chips since the exposed back surfaces 104 can be used for heat removal. For instance, a heat sink may be attached to the back surfaces 104 of the chips 100.

Each bridge chip 120 may include, but is not limited to, a semiconductor chip having interconnections fabricated therein. The bridge chip 120 (e.g., 120AB) may interconnect each terminal formed at one side, which is bound to one chip (e.g., 100A), to a corresponding terminal formed at other side, which is bound to another chip (e.g., 100B).

In a particular embodiment, each bridge chip 120 may be made of a semiconductor material such as, for example, Si, SiGe, Ge, GaAs, GaP, InSb. As shown in FIG. 3A, the bridge chip 120AB may also have a front surface 122AB and a back surface 124AB opposite to the front surface 122AB. Each bridge chip 120 may have such surfaces that are indicated in the figures with letters that correspond to the respective bridge chip 120. The front surface 122AB is a surface where a set of chip-bridge joints 130 is formed. The chip-bridge joints 130 of the bridge chip 120AB may be divided into two subsets, including a first subset 130A to join to the chip 100A and a second subset 130B to join to the chip 100B.

The bridge chip 120 is generally smaller than the chips 100 to be bridged. In the bridged multi-chip assembly structure 150, the bridge chip 120 is bonded to both of the adjacent two chips 100 at its ends by the sets of chip-bridge joints 130A, 130B. Each of the chip-bridge joints 130 may be a micro-bump that is much smaller than the typical C4 bumps.

As shown in FIG. 2A and FIGS. 3A and 3B, the bridged multi-chip assembly structure 150 further includes an underfill material 132 formed around the chip-bridge joints 130 between the bridge chip 120 and the corresponding adjacent chips 100. The underfill material 132 is indicated in the figures with letters that correspond to the respective bridge chip 120. The underfill material 132 (e.g., 132AB) encapsulates the chip-bridge joints 130 (e.g., 130A, 130B) and rigidly fixes the bridge chip 120 (e.g., 120AB) and the corresponding adjacent chips 100 (e.g., 100A, 100B) to each other. Examples of the underfill material 132 may include epoxy-based resin material.

The gap part 110G of the extension part 110 fixing the two adjacent chips 100 (e.g., 100A, 100B) has an interfacial surface 112 in contact with the corresponding underfill material 132. The interfacial surface 112 is approximately flush with the plane of the front surfaces 102 (e.g., 102A) of the two adjacent chip 100 (e.g., 100A, 100B).

As shown in FIG. 3B, before bonding to the organic substrate 140, there is a set of bumps 106 for each chip 100 in the bridged multi-chip assembly structure 150. The bumps 106 are indicated in the figures with letters that correspond to the respective chip 100. Each bump 106 may be any suitable form including, but not limited to, a solder bump and a solder capped Cu pillar bump. Each bump 106 would become the chip-substrate joint 146 after bonding to the organic substrate 140 as shown in FIGS. 2A and 2B. The set of bumps 106 (also the resultant chip-substrate joints 146) for each chip 100 forms a two-dimensional array with one or more notch areas where the corresponding bridge chip 120 are overlapped. The joints 146 are indicated in the figures with letters that correspond to the respective chip 100. The set of chip-bridge joints 130 (e.g., 130A) for a particular chip 100 (e.g., 100A) and a particular bridge chip 120 (e.g., 120AB) also forms a two-dimensional array located at the notch area of the two-dimensional array of the bumps 106 (e.g., 106A) of the chip 100 (e.g., 100A). Each notch area is located around a position corresponding to the center of the two adjacent chips 100 (e.g., 100A, 100B).

In a particular example, each chip 100 may be approximately a square having dimensions of approximately 10-30 millimeter by approximately 10-30 millimeter and a thickness of approximately 750-800 micrometers when considering a 300 mm wafers or a 50 micrometer thickness when considering back-grinding. Each chip 100 may have bumps having a pitch of, for example, approximately 100-200 micrometers, a diameter of, for example, approximately 50-100 micrometers, and a height of, for example, approximately 50-100 micrometers.

In a particular example, the bridge chip 120 may have dimensions of approximately 1-5 millimeters by approximately 2-10 millimeters and a thickness of approximately 30-250 micrometers. The bridge chip 120 may have micro bumps having a pitch of approximately 20-80 micrometers, a diameter of approximately 10-40 micrometers, and a height of approximately 10-40 micrometers.

In a particular embodiment, the distance between the back surface 124 of the bridge chip 120 and a plane of the front surfaces 102 of the adjacent chips 100, or the sum of the bridge chip thickness and the height of the micro-bump or joints between the chip 100 and bridge chip 120, is less than the height of the bumps 106 or joints 146 between the chip 100 and the organic substrate 140.

The thinner the bridge chip 120, the more fragile it becomes. Therefore, the bridge chip 120 is generally required to have a certain minimum thickness in order to withstand the mechanical stresses acting on the bridge chip 120. In particular, the force acting on parts around the bridge chip 120 becomes relatively large when the adjacent chips 100 bonded to the bridge chip 120 are separated. Furthermore, the mechanical stress becomes relatively large when the CTE difference between the chips 100 and the organic substrate 140 is large. However, if the bridge chip 120 is made thicker than a certain thickness, the bridge chip 120 will not fit into the gap between the chips 100 and the organic substrate 140 since the distance of the gap is limited by the height of the bumps 106 or joints 146.

Accordingly, one way to accommodate a thicker bridge chip can include forming a recess, cavity, or trench at the front surface of the organic substrate to avoid interference between a thicker bridge chip and the organic substrate. In contrast, the presence of the extension part 110 (especially its gap part 110G) of the molding material, which rigidly fixes the plurality of chips 100, allows for a thinner bridge chip, thereby eliminating the need to form such a recess, cavity, or trench on the organic substrate 140.

As shown in FIG. 2A, the bridged multi-chip assembly structure 150 does not include a recess, cavity or trench under the bridge chip 120. This reduces a fabrication cost of the bridged multi-chip assembly structures. However, this does not prevent the formation of the recess, cavity, or trench to the organic substrate 140.

As shown in FIGS. 2A and 2B, the bridged multi-chip assembly structure 150 further includes an encapsulation material 148 formed between the pre-molded multi-chip structure 114 and the organic substrate 140. The encapsulation material 148 encapsulates the bridge chip 120 and the sets of chip-substrate joints 146 between the plurality of chips 100 and the organic substrate 140. The underfill material 132 formed around the chip-bridge joints 130 may be merged into the encapsulation material 148. The underfill material 132 and the encapsulation material 148 rigidly fix fragile components in the bridged multi-chip assembly structure 150. Examples of the encapsulation material 148 may include epoxy-based resin material. Although the underfill material 132 and the encapsulation material 148 are referred to by different names, the underfill material 132 and the encapsulation material 148 may be substantially the same.

The organic substrate 140 is connected to the plurality of chips 100 by the sets of chip-substrate joints 146. The organic substrate 140 has an array of terminals 144 formed at a bottom surface 142 of the organic substrate opposite to a top surface 141 to which the plurality of chips 100 is bonded. The array of terminals 144 is provided for subsequent attachment of the bridged multi-chip assembly structure 150 to a next level of assembly, such as a mother board.

The array of terminals 144 may be, for example, a ball grid array (BGA), a land grid array (LGA), or a pin grid array (PGA).

The organic substrate 140 may be an organic laminate or similar material. The organic substrate 140 may include three distinct parts: the surface finish for soldering and adhesion; buildup layers containing most of the wiring and vias; and a core, which provides mechanical strength. Optionally, a solder mask may be provided on the laminate, or a build-up dielectric can be provided on the top surface 141. As such, the organic substrate 140 can include a plurality of wiring layers and insulating layers.

The core of the organic substrate 140 is typically composed of glass-fiber-reinforced epoxy, jacketed in subtractively circuitized copper sheets. Most commonly, cores consist of a single dielectric layer, although multilayer cores can be used, formed by conventional laminated printed circuit board processing techniques. The wiring in the organic substrate 140 connects an upper chip-substrate joint 146 and a corresponding lower terminal 144. Such organic or resin material typically has a higher CTE than the material of the chips 100.

With reference to FIGS. 4A-4G, FIGS. 5A and 5B, and FIGS. 6A-6F, schematic drawings illustrate a process of manufacturing a bridged multi-chip assembly structure according to an example embodiment of the present disclosure. FIGS. 4A-4G and FIGS. 6A-6F illustrate the process of manufacturing the bridged multi-chip assembly structure 150 that is shown in FIGS. 2A and 2B and FIGS. 3A and 3B. Note that FIGS. 4A-4G and FIGS. 6A-6F show cross-sectional views of structures.

In accordance with at least one embodiment of the present disclosure, FIGS. 4A-4C and FIGS. 5A-5B illustrate results of the performance of operation 12 of the method 10 shown in FIG. 1.

Figure 4A:
FIG. 4A illustrates an example of a component following the performance of a portion of a process for manufacturing a bridged multi-chip assembly, in accordance with embodiments of the present disclosure.

As shown in FIG. 4A, the manufacturing process may include preparing or providing a carrier substrate 300, which may have a wafer or a panel form. The carrier substrate 300 may be rigid in order to support a structure formed on the top thereof. Examples of the carrier substrate 300 may include, without limitation, a semiconductor wafer, such as a silicon wafer, a glass panel, and the like.

Figure 4B:
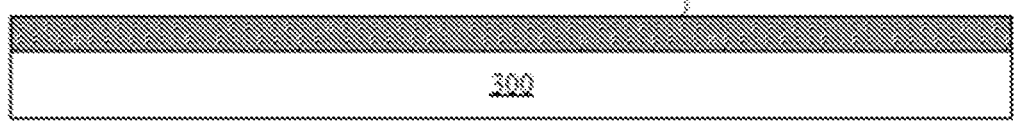
FIG. 4B illustrates an example of a component following the performance of a portion of a process for manufacturing a bridged multi-chip assembly structure, in accordance with embodiments of the present disclosure.

As shown in FIG. 4B, the manufacturing process may also include applying a resin material on the carrier substrate 300 to form a resin layer 302. The resin material may be a photoresist resin. Any positive or negative type photoresist resin can be used. Fabrication of the resin layer 302 may include performing conventional coating techniques, including, for example, spin coating.

Figure 4C:
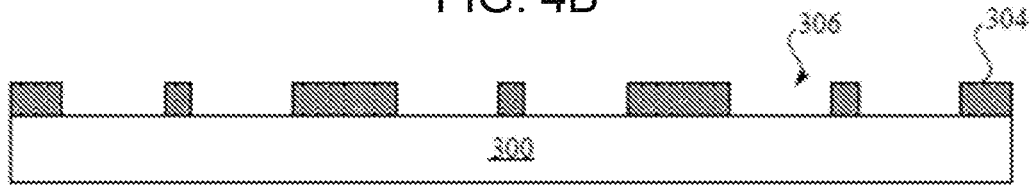
FIG. 4C illustrates an example of a component following the performance of a portion of a process for manufacturing a bridged multi-chip assembly structure, in accordance with embodiments of the present disclosure.

As shown in FIG. 4C, the manufacturing process may further include patterning the resin material to give a patterned layer 304 on the carrier substrate 300 having spaces (or openings) 306. In FIG. 4C, for illustrative purposes, only one element is assigned a numeral, representatively. However, the same numeral applies to other corresponding components shown in FIGS. 4A-4G, FIGS. 5A and 5B, and FIGS. 6A-6F. The set of bumps 106 of each chip 100 to be arranged is accommodated when performing subsequent procedures. Patterning of the resin layer 302 may include performing a conventional photolithography technique, which may typically include pre-baking, exposure, post exposure baking, development, and post baking.

By performing the operations discussed above with reference to FIGS. 4A-4C, the carrier substrate 300 having a patterned layer 304 that is patterned to define a predetermined layout of the plurality of chips 100 is provided.

Figure 5A:
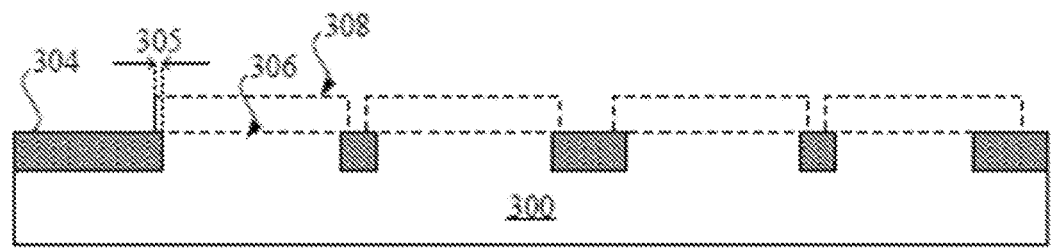
FIG. 5A illustrates a schematic cross-sectional view of a patterned layer formed on a carrier substrate during the process, in accordance with embodiments of the present disclosure.
Figure 5B:
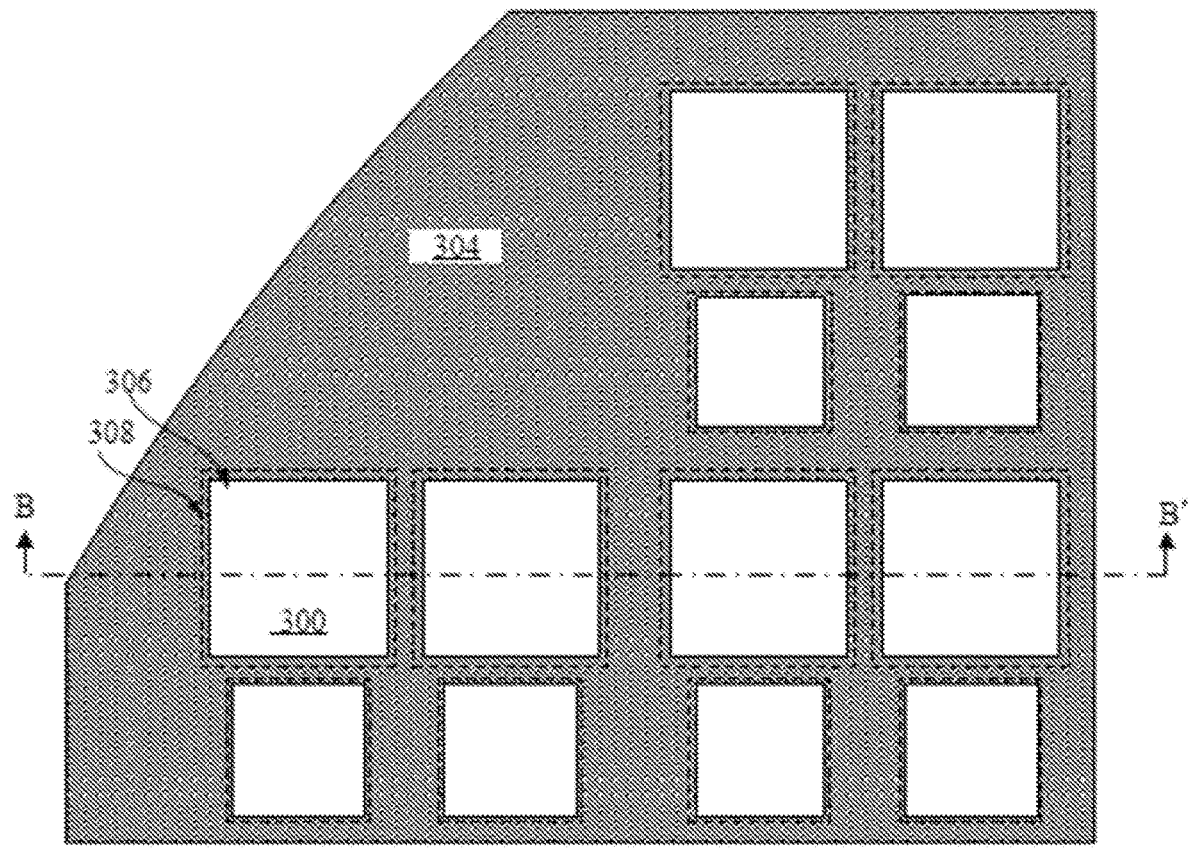
FIG. 5B illustrates a schematic top view of a patterned layer formed on a carrier substrate during the process, in accordance with embodiments of the present disclosure.

FIGS. 5A and 5B illustrate a schematic of a patterned layer 304 formed on the carrier substrate 300 by the process illustrated by FIG. 4C. More specifically, FIG. 5A shows a cross-sectional view of the patterned layer 304 formed on the carrier substrate 300, and FIG. 5B shows a top view of the patterned layer 304. Note that the cross-sectional view shown in FIG. 5A corresponds to a cross-section denoted by a one-dot chain line B-B' shown in the top view of FIG. 5B.

In FIGS. 5A and 5B, the outlines of the chips 100 that will be arranged are indicated by dashed rectangles 308. In the figures, only one dashed rectangle is labeled with the numeral 308, representatively. As shown in FIGS. 5A and 5B, the space 306 that is fabricated into the layer 304 for each chip 100 has slightly smaller width and height dimensions than the outline 308 of the chip 100. Therefore, the patterned layer 304 has a part 305 (shown in FIG. 5A) that will overlap with the peripheral region of the chips 100. This part 305 will support the front surface of the chip 100 at the peripheral region when the chip 100 is arranged to the carrier substrate 300. For reference, there is a peripheral region for each chip 100. In at least one embodiment, the peripheral region for each chip 100 has a width of several hundred micrometers. The presence of this overlapping part 305 makes the front surfaces 102 of the chips 100 flush and facilitates vertical alignment between chips 100 even if there is non-negligible variation/deviation in the thickness of chips 100.

Figure 4D:
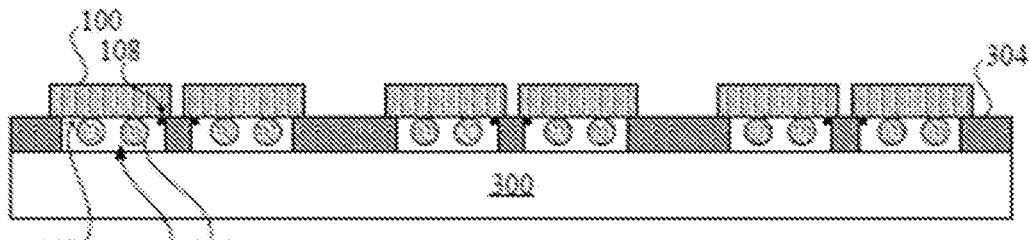
FIG. 4D illustrates an example of a component following the performance of a portion of a process for manufacturing a bridged multi-chip assembly structure, in accordance with embodiments of the present disclosure.

In accordance with at least one embodiment of the present disclosure, FIG. 4D illustrates results of the performance of operation 14 of the method 10 shown in FIG. 1. As shown in FIG. 4D, the manufacturing process may include arranging a plurality of chips 100 on the patterned layer 304 in a predetermined layout with each front surface 102 facing the carrier substrate 300. The front surface 102 of each chip 100, including a set of terminals 108 for bridging and the set of bumps 106 for bonding to the organic substrate 140, is placed on the carrier substrate 300 upside down. The set of bumps 106 (and also the set of terminals 108) of each chip 100 is accommodated in the space 306 formed in the patterned layer 304 when arranging the plurality of chips 100.

Arranging the plurality of chips 100 on the carrier substrate 300 in the predetermined layout may include using an appropriate alignment mark. The alignment mark of the chip side can be formed on the front surface 102A of each chip 100. The alignment mark of the carrier substrate 300 can be formed on the top surface of the carrier substrate 300. The performance of post baking in a standard lithography process may be delayed until after the arrangement of the chips 100 in order to make the chips 100 and the patterned layer 304 adhere more firmly.

Figure 4E:
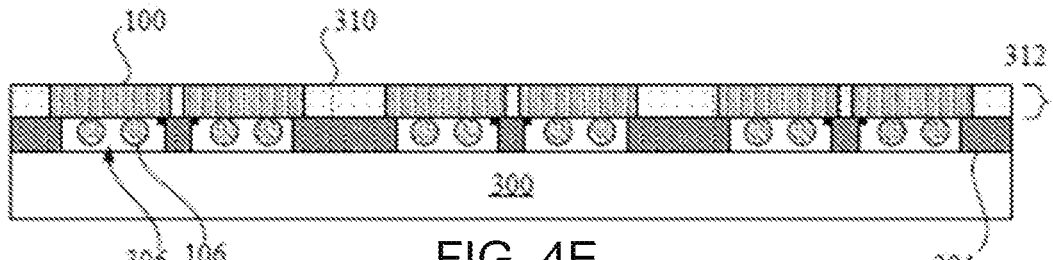
FIG. 4E illustrates an example of a component following the performance of a portion of a process for manufacturing a bridged multi-chip assembly structure, in accordance with embodiments of the present disclosure.

In accordance with at least one embodiment of the present disclosure, FIG. 4E illustrates results of the performance of operation 16 of the method 10 shown in FIG. 1. As shown in FIG. 4E, the manufacturing process may further include depositing a molding material 310 between and around the plurality of chips 100 and on the patterned layer 304 to form a part corresponding to the extension part 110 that is shown in FIGS. 2A and 2B and FIGS. 3A and 3B. Depositing the molding material results in a wafer or panel shaped structure 312 (also referred to as a pre-molded multi-chip structure) containing the plurality of chips 100 and the molding material 310. The set of bumps 106 (and also the set of terminals 108) of each chip 100 is accommodated in the space 306 formed in the patterned layer 304 when depositing the molding material 310 between and around the plurality of chips 100.

The fabrication of the wafer or panel shaped structure 312 may be completed by performing a conventional molding technique. The components of the carrier substrate 300 (including the patterned layer 304 and the chips 100) and external rigid structure may be used as a mold, onto which molten or liquid material is applied. Also, the molding material can also be applied between the chips 100 by dispensing the molding material into a gap between the adjacent chips 100, using a squeegee to spread the molding material across the surface of the structure, and/or other coating techniques.

Figure 4F:
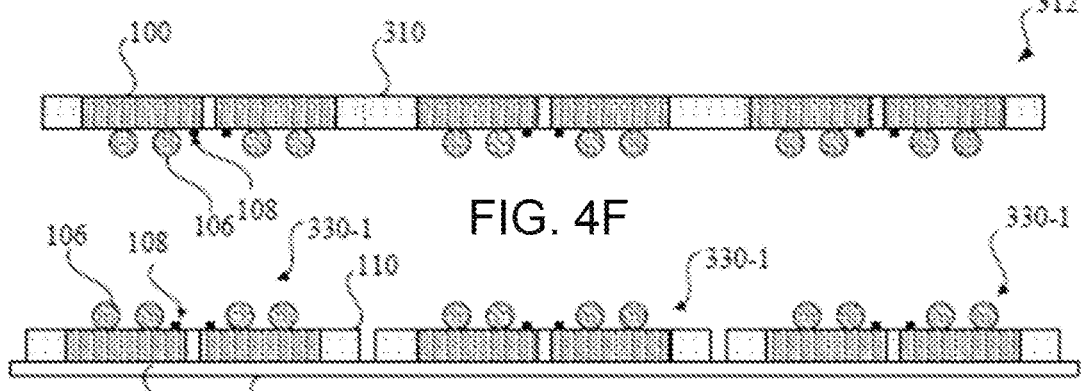
FIG. 4F illustrates an example of a component following the performance of a portion of a process for manufacturing a bridged multi-chip assembly structure, in accordance with embodiments of the present disclosure.

In accordance with at least one embodiment of the present disclosure, FIG. 4F illustrates results of the performance of operation 18 of the method 10 shown in FIG. 1. As shown in FIG. 4F, the manufacturing process may include a step of removing the carrier substrate 300 and the patterned layer 304 from the wafer or panel shaped structure 312. In a particular embodiment, the separation of the carrier substrate 300 from the wafer or panel shaped structure 312 may be completed by using a laser releasable temporary bonding and debonding technique. In a particular embodiment, the removal of the patterned layer 304 may be completed by dissolving into solvent.

Figure 4G:
FIG. 4G illustrates an example of a component following the performance of a portion of a process for manufacturing a bridged multi-chip assembly structure, in accordance with embodiments of the present disclosure.

As shown in FIG. 4G, the manufacturing process may include dicing the wafer or panel shaped structure 312 into multiple pieces of bridged multi-chip assemblies. The dicing may be completed by performing a conventional dicing technique, such as blade dicing, laser dicing (e.g., stealth dicing, laser ablation dicing), and the like. In FIG. 4G, expansion of the dicing tape 320 after the stealth dicing is illustrated as an example. As shown in FIG. 4G, a plurality of pre-molded multi-chips 330-1, each of which contains a predetermined set of chips 100 and the extension part 110 surrounding the predetermined set of chips 100, is obtained.

Figure 6A:
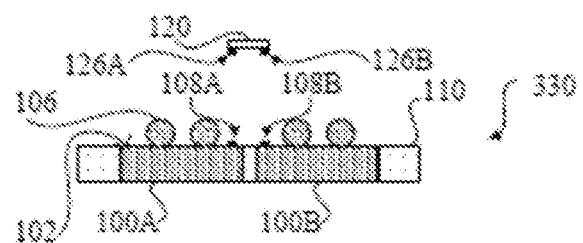
FIG. 6A illustrates an example of a component following the performance of a portion of a process for manufacturing the bridged multi-chip assembly structure, in accordance with embodiments of the present disclosure.

As shown in FIG. 6A, the manufacturing process may include picking up a pre-molded multi-chip 330 (which may be, for example, one of the pre-molded multi-chips 330-1 illustrated in FIG. 4G) and preparing a bridge chip 120 for each required bridging location. The pre-molded multi-chip 330 contains the predetermined set of chips 100A, 110B and the extension part 110. Each chip 100 has the front surface 102 including the set of bumps 106 and the set of terminals 108 (108A and 108B) exposed. The prepared bridge chip 120 may have sets of terminals 126A, 126B formed at the front surface 122 (shown in FIG. 3A) thereof. The set of terminals 126 may be micro-bumps.

Figure 6B:
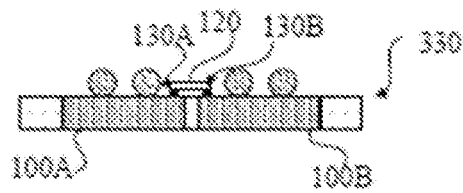
FIG. 6B illustrates an example of a component following the performance of a portion of a process for manufacturing the bridged multi-chip assembly structure, in accordance with embodiments of the present disclosure.

In accordance with at least one embodiment of the present disclosure, FIG. 6B illustrates results of the performance of operation 20 of the method 10 shown in FIG. 1. As shown in FIG. 6B, the manufacturing process may include bonding the prepared bridge chip 120 to corresponding adjacent chips 100A, 100B in the pre-molded multi-chip 330 to form sets of chip-bridge joints 130A, 130B. As shown in FIG. 6B, the sets of chip-bridge joints 130A, 130B between the bridge chip 120 and the corresponding adjacent chips 100A, 100B may be formed by using the corresponding sets of terminals 108A, 108B of the chips 100A, 100B and corresponding sets of terminals 126A, 126B of the bridge chip 120.

Figure 6C:
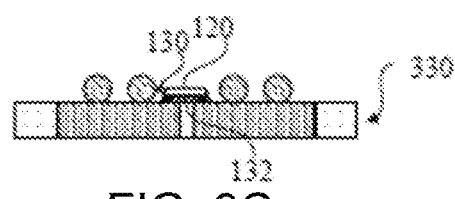
FIG. 6C illustrates an example of a component following the performance of a portion of a process for manufacturing the bridged multi-chip assembly structure, in accordance with embodiments of the present disclosure.

As shown in FIG. 6C, the manufacturing process may include applying an underfill material 132 around the sets of bride-chip joints 130 between each bridge chip 120 and the corresponding adjacent chips 100. Applying the underfill material 132 may include a conventional underfill technique, such as, for example, capillary underfilling process.

The underfill material 132 may be applied subsequent to the bonding the prepared bridge chip 120 to the corresponding adjacent chips 100A, 100B. However, in alternative embodiments, a pre-applied underfill, such as non-conductive paste, may also be used. In such embodiments, prior to bonding the prepared bridge chip 120 to the corresponding adjacent chips 100A, 100B, the manufacturing process may include applying an underfill material 132 around positions of the terminals 108 where the sets of bride-chip joints 130 between each bridge chip 120 and the corresponding adjacent chips 100 will be formed by the subsequent bonding process. Note that the yield of the products can be improved by using capillary underfilling instead of the pre-applied underfill. Since the bridge chip 120 and the corresponding chips 100 onto which it is placed are rigidly fixed to each other by the extension part 110 (especially its gap part 110G) of the molding material, the utility of pre-applied underfill that can provide strength immediately after bonding is reduced and can be eliminated.

Figure 6D:
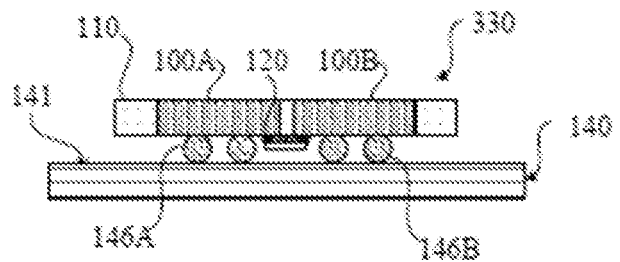
FIG. 6D illustrates an example of a component following the performance of a portion of a process for manufacturing the bridged multi-chip assembly structure, in accordance with embodiments of the present disclosure.

As shown in FIG. 6D, the manufacturing process may include bonding the pre-molded multi-chip 330 containing the plurality of chips 100A, 100B and the bridge chip 120 to an organic substrate 140 to form sets of chip-substrate joints 146A, 146B. As shown in FIG. 6D, the pre-molded multi-chip 330 is placed on a top surface 141 of the organic substrate 140.

Figure 6E:
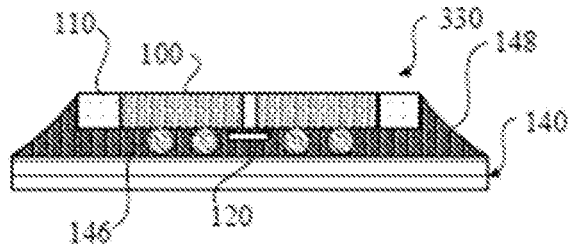
FIG. 6E illustrates an example of a component following the performance of a portion of a process for manufacturing the bridged multi-chip assembly structure, in accordance with embodiments of the present disclosure.

As shown in FIG. 6D, and before the encapsulation shown in FIG. 6E, the mechanical stress around the chip-bridge joints 130 between the chip 100 and the bridge chip 120 is generated by heat (used in the bonding process) due to the difference in the CTE between the chips 100 and the organic substrate 140. Such mechanical stress can lead to a failure and degradation of the yield of the packaging products. However, embodiments of the present disclosure can prevent the failure of the joints since the chips 100 have been rigidly fixed to each other by the extension part 110 (especially its gap part 110G) of the molding material, and the bridge chip 120 is bonded to such rigidly fixed chips 100. Accordingly, displacement between the bridged chips 100 when connecting to the organic substrate 140 due to the CTE difference can be prevented.

As shown in FIG. 6E, the manufacturing process may include encapsulating the bridge chip 120 and the sets of chip-substrate joints 146 between the plurality of chips 100 and the organic substrate 140 by the encapsulation material 148.

Figure 6F:
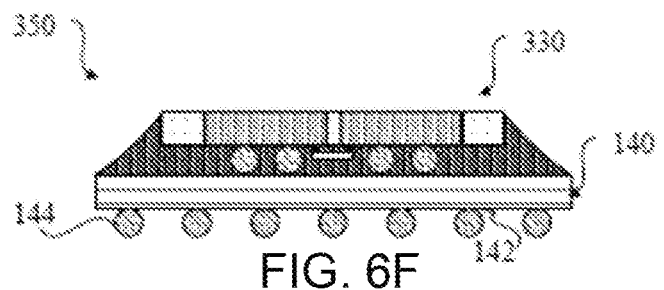
FIG. 6F illustrates an example of a component following the performance of a portion of a process for manufacturing the bridged multi-chip assembly structure, in accordance with embodiments of the present disclosure.

As shown in FIG. 6F, the manufacturing process may include fabricating an array of terminals 144 (that is a BGA in the example shown in FIG. 6F) at the bottom surface 142 of the organic substrate 140 to obtain a final integrated package 350. The integrated package 350 can be provided for subsequent attachment process to a next level of assembly, such as a mother board.

In the aforementioned embodiments, the bridge chip 120 is bonded to singulated pre-molded multi-chips 330. However, in other embodiment, before dicing, the bridge chip 120 may be bonded to each part of the wafer or panel shaped structure 312 that would become a pre-molded multi-chips structure 330 after the dicing.

Figure 7A:
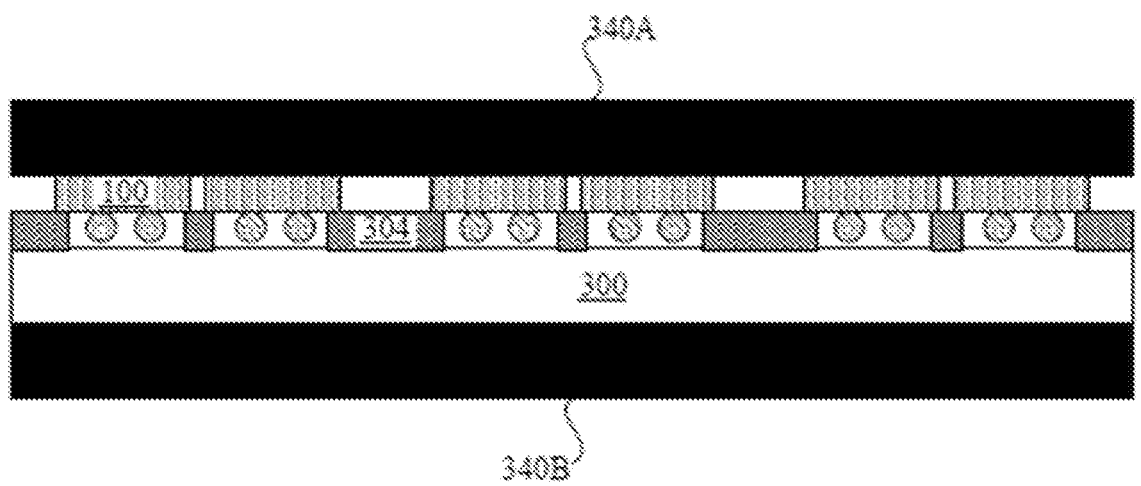
FIG. 7A illustrates an example of a component following the performance of a portion of a process for depositing a molding material between and around a plurality of chips and on a patterned layer formed on a carrier substrate, in accordance with embodiments of the present disclosure.
Figure 7B:
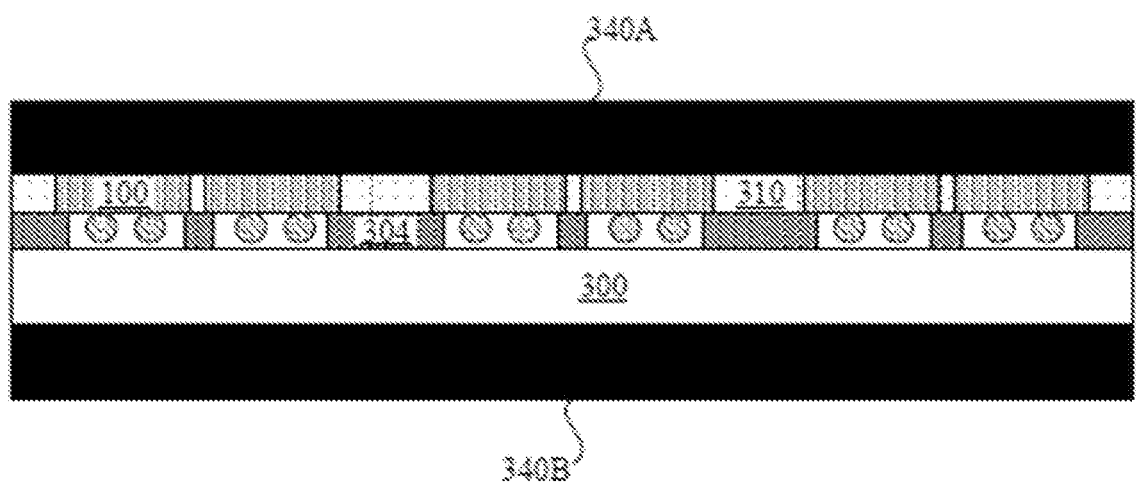
FIG. 7B illustrates an example of a component following the performance of a portion of a process for depositing a molding material between and around a plurality of chips and on a patterned layer formed on a carrier substrate, in accordance with embodiments of the present disclosure.
Figure 7C:
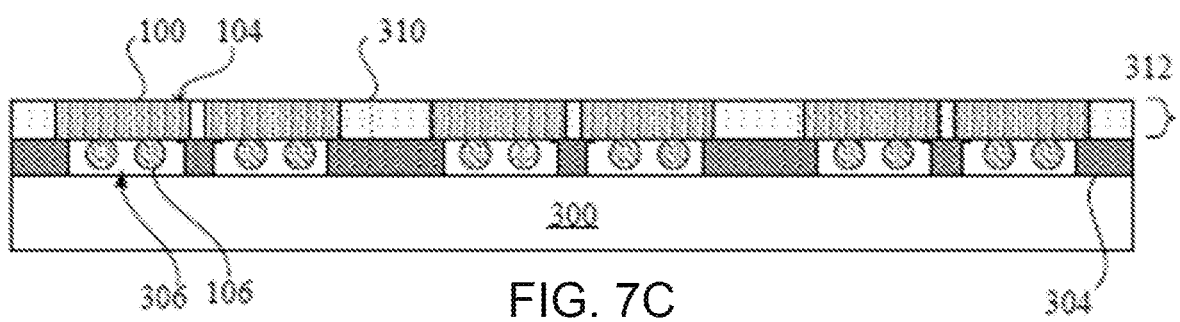
FIG. 7C illustrates an example of a component following the performance of a portion of a process for depositing a molding material between and around a plurality of chips and on a patterned layer formed on a carrier substrate, in accordance with embodiments of the present disclosure.

With reference to FIGS. 7A-7C, depositing the molding material between and around the plurality of chips 100 according to an example embodiment of the present disclosure is described in more detail. In particular, FIGS. 7A-7C illustrate results of depositing the molding material in a manner that is suitable for instances in which the plurality of chips 100 has uniform chip thickness. Accordingly, FIGS. 7A-7C illustrate results of the performance of operation 16 of the method 10 shown in FIG. 1, in accordance with at least one embodiment of the present disclosure.

As shown in FIG. 7A, depositing the molding material may include placing, between metal molds 340A, 340B, a structure containing the plurality of chips 100, the patterned layer 304 and the carrier substrate 300. The metal mold 340A may be in close contact with the back surface 104 of the chip 100.

As shown in FIG. 7B, depositing the molding material may also include injecting the molding material into gaps between the plurality of chips 100. As shown in FIG. 7C, injecting the molding material into the gaps between the plurality of chips 100 results in the wafer or panel shaped structure 312 containing the molding material 310 and the plurality of chips 100 such that the back surface 104 of each of the chips 100 is exposed.

Figure 8A:
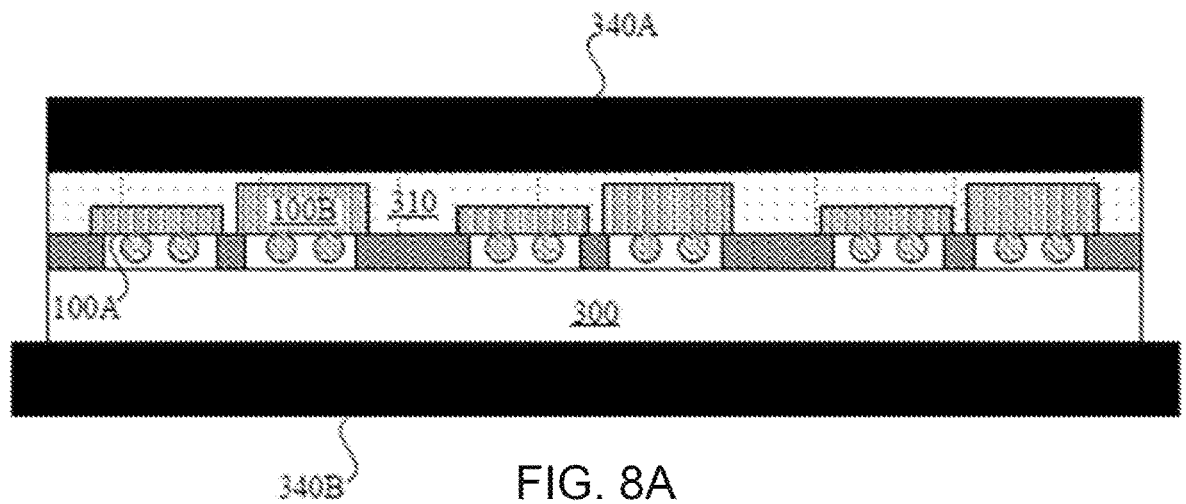
FIG. 8A depicts illustrates an example of a component following the performance of a portion of another process for depositing a molding material between and around a plurality of chips and on a patterned layer formed on a carrier substrate, in accordance with embodiments of the present disclosure.
Figure 8B:
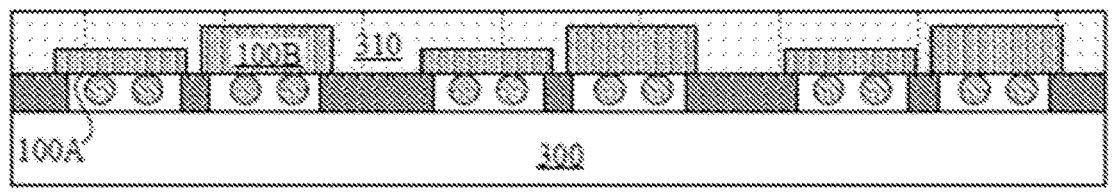
FIG. 8B depicts illustrates an example of a component following the performance of a portion of a process for depositing a molding material between and around a plurality of chips and on a patterned layer formed on a carrier substrate, in accordance with embodiments of the present disclosure.
Figure 8C:
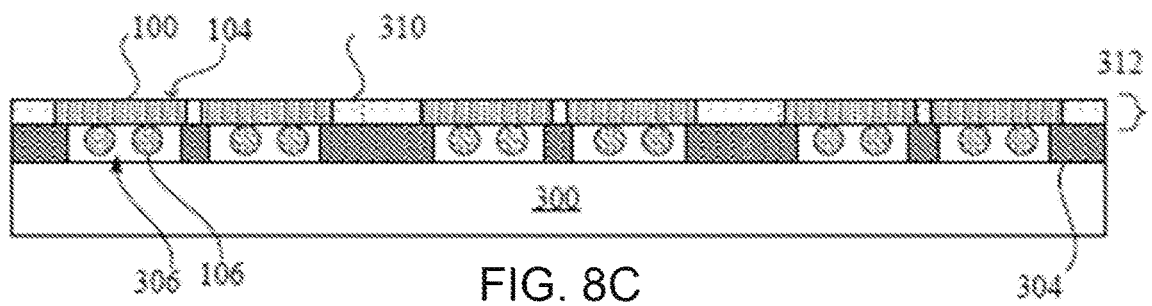
FIG. 8C depicts illustrates an example of a component following the performance of a portion of a process for depositing a molding material between and around a plurality of chips and on a patterned layer formed on a carrier substrate, in accordance with embodiments of the present disclosure.

With reference to FIGS. 8A-8C, depositing a molding material according to another example embodiment of the present disclosure is described in more detail. In particular, FIGS. 8A-8C illustrate results of depositing the molding material in a manner that is suitable for instances in which there is non-negligible variation/deviation in the thickness of chips 100. Such variation may be caused by differences in individual wafers from which each chip 100 has been singulated and/or differences in functions of the chips 100. Accordingly, FIGS. 8A-8C illustrate results of the performance of operation 16 of the method 10 shown in FIG. 1, in accordance with at least one embodiment of the present disclosure.

As shown in FIG. 8A, depositing the molding material may include placing, between metal molds 340A, 340B, a structure containing the patterned layer 304, the carrier substrate 300 and the plurality of chips 100A, 100B having a different chip thickness. The metal mold 340A is not in close contact with the back surface of the chips 100.

As further shown in FIG. 8A, depositing the molding material may also include injecting the molding material 310 into gaps between and over the plurality of chips 100.

As shown in FIG. 8B, depositing the molding material may further include removing the metal molds following the injection of the molding material.

As shown in FIG. 8C, depositing the molding material may further include thinning the molding material and the chips 100 from the back side of the chips 100A, 100B such that a wafer or panel shaped structure 312 (a pre-molded multi-chip structure) containing the plurality of chips 100 and the molding material 310 has a uniform thickness. Thinning the molding material and the chips 100 includes removing some amount of the molding material and the chips 100. The thinning may be completed by, for example, performing a back-grinding process.

As shown in FIG. 8C, thinning results in the wafer or panel shaped structure 312 containing the molding material 310 and the plurality of chips 100, each of which exposes the back surface 104 thereof. Note that, in the described embodiment, the wafer or panel shaped structure 312 is thinned to expose the back surface 104 of every chip 100. However, in other embodiments, the wafer or panel shaped structure 312 may have one or more chips the back surface of which remains covered by the molding material 310.

Figure 9A:
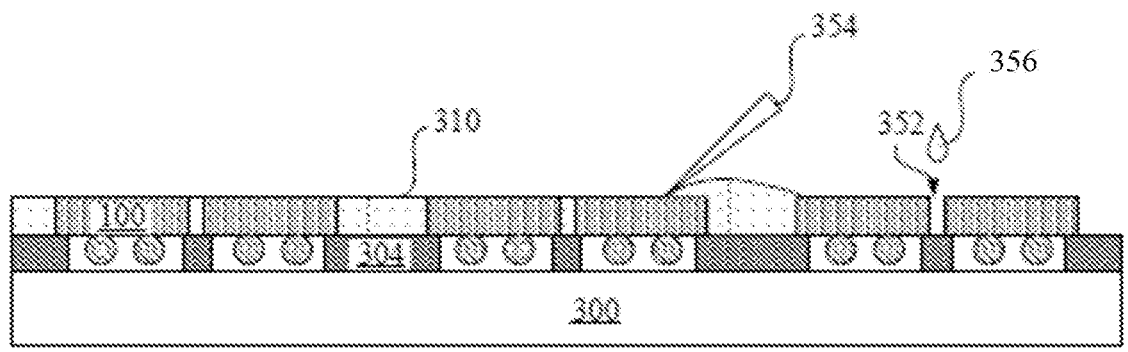
FIG. 9A illustrates an example of depositing a molding material between and around a plurality of chips and on a patterned layer formed on a carrier substrate, in accordance with embodiments of the present disclosure.

With reference to FIG. 9A, depositing a molding material according to another example embodiment of the present disclosure is described in more detail. In particular, FIG. 9A illustrates the results of depositing a molding material in a manner that is suitable for instances without using the metal molds 340A, 340B. Accordingly, FIG. 9A illustrates results of the performance of operation 16 of the method 10 shown in FIG. 1, in accordance with at least one embodiment of the present disclosure.

As shown in FIG. 9A, depositing the molding material may include dispensing a droplet 356 of a molding material into a gap 352 between adjacent chips 100 and around the plurality of chips 100. As further shown in FIG. 9A, depositing the molding material may also include spreading the applied molding material by dragging a squeegee 354 across the surface of the structure (300, 304, 100).

Note that, in the described embodiments, not only gaps between the adjacent chips 100 but also the spaces around the chips 100 are filled by the molding material 310 to form the wafer or panel shaped structure 312. However, in other embodiments, only gaps between the adjacent chips 100 may be filled, and the spaces corresponding to the peripheries of the predetermined set of chips 100 may not be filled.

Figure 9B:
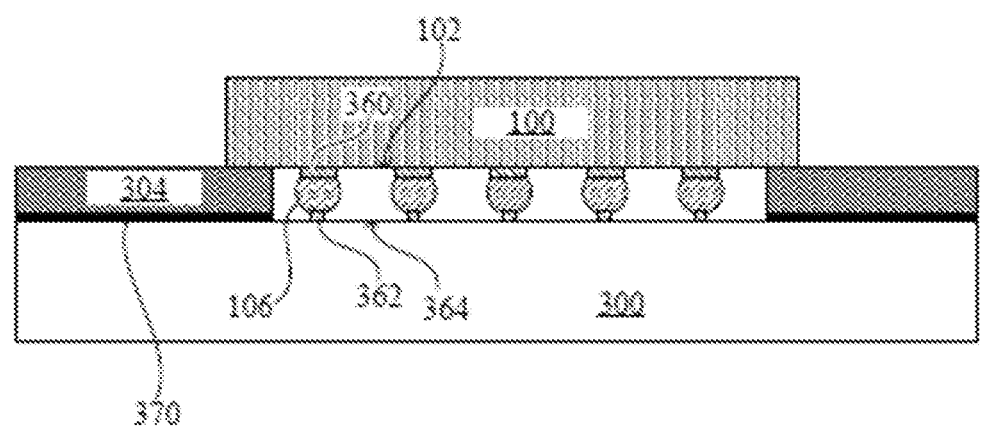
FIG. 9B illustrates an example of a structure used for firmly fixing a plurality of chips to a patterned layer of a carrier substrate, in accordance with embodiments of the present disclosure.

With reference to FIG. 9B, arranging a plurality of chips 100 on the carrier substrate 300 and removing the carrier substrate 300 and the patterned layer 304 from the wafer or panel shaped structure according to a particular example embodiment are described.

As shown in FIG. 9B, the set of bumps 106 is formed on an under bump metallurgy (UBM) 360 fabricated at the front surface 102 of each chip 100. Furthermore, a top surface 364 of the carrier substrate 300 includes an array of micro-pads 362 on which each chip is to be arranged. Arranging the plurality of chips 100 includes temporarily fixing the set of bumps 106 and the array of micro-pads 362 by temporal bonding. Removing the carrier substrate 300 and the patterned layer 304 from the plurality of chips 100 includes debonding the array of micro-pads 362 from the set of bumps 106 by heating. Each micro-pad 362 is smaller than the corresponding UBM 360 in order to minimize the volume change of the solder bump after debonding and may preferably be made of a less impacted material set (e.g., Ti or Au) to eliminate solder composition change.

As further shown in FIG. 9B, there is a release layer 370 between the carrier substrate 300 and the patterned layer 304. In a particular embodiment, the release layer 370 is a laser releasable layer, which is used in the laser releasable temporary bonding and debonding technique. By irradiating the laser to the release layer 370 (e.g., infrared laser when using a silicon wafer or UV laser when using a glass panel) from the backside of the carrier substrate 300 after the molding, the carrier substrate 300 can be easily separated from the wafer or panel shaped structure 312.

In the above-mentioned embodiments, the sets of bumps 106 are fabricated before the chip arrangement. However, forming the bumps is not limited to this timing. With reference to FIGS. 10A-10G, a schematic of a result of a process of manufacturing a bridged multi-chip assembly structure according to another example embodiment of the present disclosure is described. FIGS. 10A-10G (together with FIGS. 6A-6F) illustrate results of the process of manufacturing the bridged multi-chip assembly structure 150 that is shown in FIGS. 2A and 2B and FIGS. 3A and 3B. Note that FIGS. 10A-10G also show cross-sectional views of structures. Accordingly, FIGS. 10A-10G illustrate results of the performance of the method 10 shown in FIG. 1, in accordance with at least one embodiment of the present disclosure.

Figures 10A, 10B, 10C, 10D, 10E, 10F, 10G:
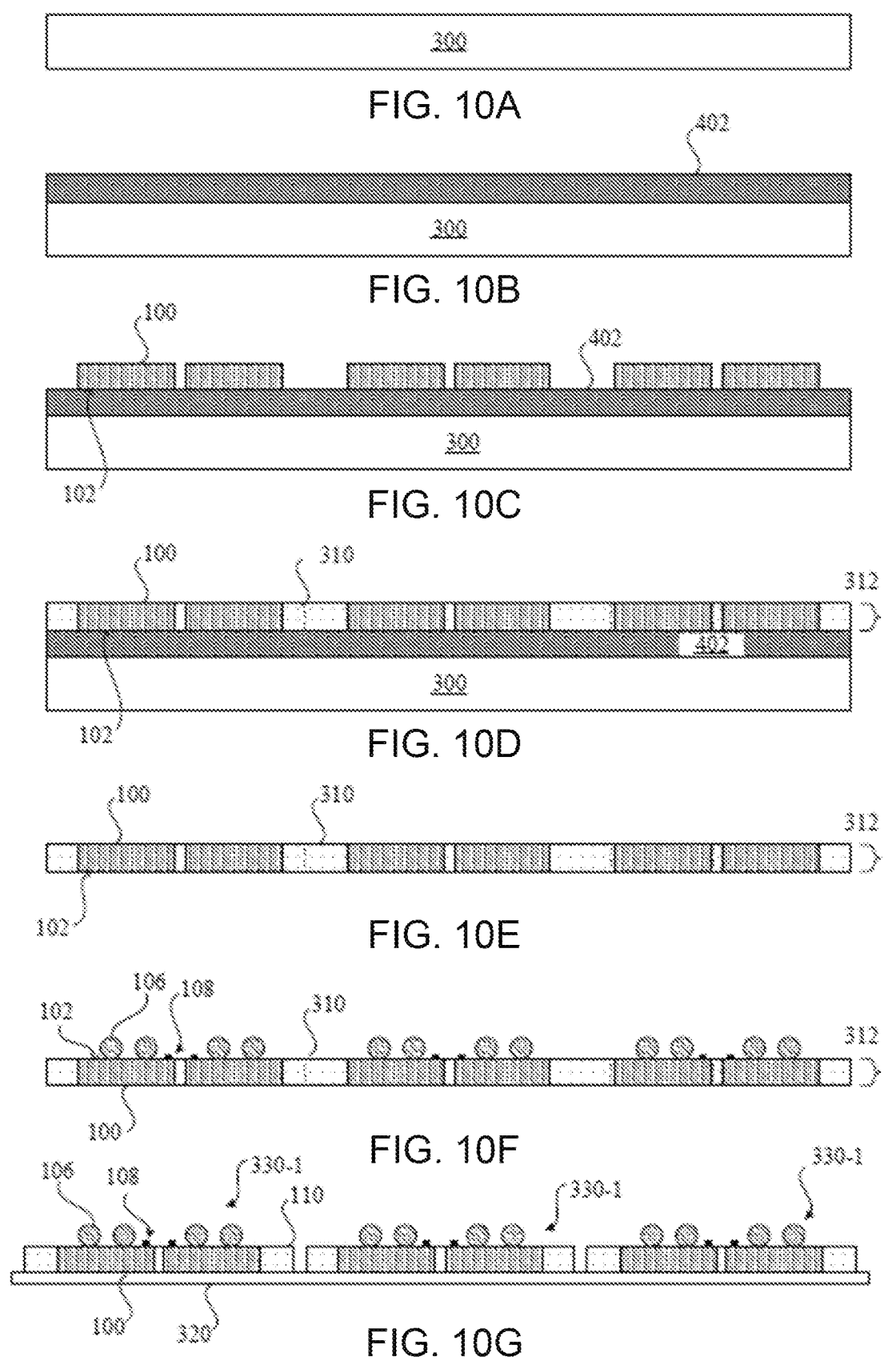

As shown in FIG. 10A, the manufacturing process may include preparing a carrier substrate 300. As shown in FIG. 10B, the manufacturing process may also include applying an adhesive material on the carrier substrate 300 to form an adhesive layer 402. The adhesive material may be a resin material. The adhesive layer 402 may be fabricated by performing conventional coating techniques, such as, for example, a spin coating. By performing the operations discussed above with reference to FIGS. 10A and 10B, the carrier substrate 300 having a patterned layer 304 that is patterned to define a predetermined layout of the plurality of chips 100 is provided. Accordingly, FIGS. 10A and 10B illustrate the results of the performance of operation 12 of the method 10, in accordance with one embodiment of the present disclosure.

As shown in FIG. 10C, the manufacturing process may include arranging a plurality of chips 100 on the adhesive layer 402 in a predetermined layout with the front surface 102 of each chip 100 facing the carrier substrate 300. Accordingly, FIG. 10C illustrates the results of the performance of operation 14 of the method 10, in accordance with one embodiment of the present disclosure.

In the embodiment shown in FIGS. 10A-10G, it is not necessary to place the plurality of chips 100 on the carrier substrate 300 with the front surface 102 of each chip 100 facing down. However, arranging the plurality of chips 100 on the carrier substrate 300 with the front surface 102 of each chip 100 facing the carrier substrate 300 is preferable. Although the front surface 102 of each chip 100 does not yet include the set of bumps 106, the front surfaces of the chips 100 are protected by the adhesive layer 402 when depositing the molding material between the plurality of chips 100 as shown in FIG. 10D. Thus, arranging the plurality of chips 100 with the front surface 102 of each chip 100 facing the carrier substrate 300 makes the front surfaces 102 of the chips 100 flush and facilitates vertical alignment between chips 100 even if there is non-negligible variation/deviation in the thickness of chips 100. Furthermore, this flatness provides an advantage during the formation of the bumps.

The plurality of chips 100 may be arranged on the carrier substrate 300 by using an appropriate alignment mark. The alignment mark of the carrier substrate 300 can be formed on the surface of the carrier substrate 300. The thickness of the adhesive layer 402 is preferably thin such that the alignment mark formed on the carrier substrate 300 is detectable even though all the area of the wafer is covered by the adhesive layer 402.

As shown in FIG. 10D, the manufacturing process may further include depositing a molding material 310 between and around the plurality of chips 100 and on the adhesive layer 402 to form a part corresponding to the extension part 110 that is shown in FIGS. 2A and 2B and FIGS. 3A and 3B. Accordingly, FIG. 10D illustrates the results of the performance of operation 16 of the method 10, in accordance with one embodiment of the present disclosure. Depositing the molding material results in a wafer or panel shaped structure 312.

As shown in FIG. 10E, the manufacturing process may include removing the carrier substrate 300 and the adhesive layer 402 from the wafer or panel shaped structure 312. Accordingly, FIG. 10E illustrates the results of the performance of operation 18 of the method 10, in accordance with one embodiment of the present disclosure.

As shown in FIG. 10F, the manufacturing process may include forming sets of bumps 106 and sets of terminals 108 (contact pads) on front surfaces 102 of the plurality of chips 100 in the wafer or panel shaped structure 312. The bumps may be fabricated by performing conventional bump forming techniques, including, for example, solder evaporation, electroplating of solder alloys, solder paste screening, solder ball placement, injection molded soldering process, etc.

As shown in FIG. 10G, the manufacturing process may include dicing the wafer or panel shaped structure 312 into multiple pieces of bridged multi-chip assemblies. A plurality of pre-molded multi-chips 330-1, each of which is identical to one shown in FIG. 4G, is obtained. After the step shown in FIG. 10G, the same process shown in FIGS. 6A-6F can be performed as in the process described with reference to the series of FIGS. 4A-4G and FIGS. 6A-6F.

Figure 11:
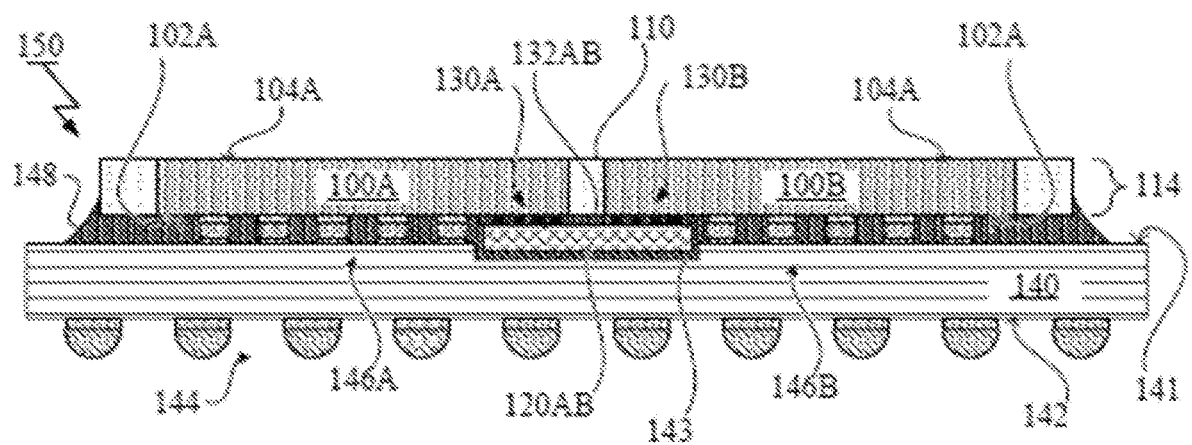
FIG. 11 illustrates a schematic cross-sectional view of a bridged multi-chip assembly structure after bonding to a recessed organic substrate, in accordance with embodiments of the present disclosure.

With reference to FIG. 11, a bridged multi-chip assembly structure according to another example embodiment of the present disclosure is described. FIG. 11 illustrates a schematic of a bridged multi-chip assembly structure after bonding to a recessed organic substrate 140 having a recess 143 formed on a top surface 141 thereof. Accordingly, FIG. 11 illustrates the results of the performance of operation 20 of the method 10, in accordance with one embodiment of the present disclosure.

Although the elimination of the need to form a recess, cavity, or trench in the organic substrate 140 is preferable, it does not prevent the formation of the recess, cavity, or trench in the organic substrate 100. In the embodiment shown in FIG. 11, the organic substrate 140 includes the recess 143 for avoiding interference between the bridge chip 120AB and the organic substrate 140. The thicker bridge chip 120 provides sufficient mechanical strength to withstand the mechanical stress acting on the bridge chip 120. The embodiment shown in FIG. 11 provides further strength that is superior relative to instances in which a thinner bridge chip is employed.

According to the embodiments of the present disclosure, a method capable of fabricating a bridged multi-chip assembly structure connecting a plurality of chips by a bridge chip while relieving stress generated around joints between the chip and the bridge chip by rigidly fixing the plurality of chips is provided. Additionally, according to the embodiments of the present disclosure, the bridged multi-chip assembly structure fabricated by the method is provided.

The method and the bridged multi-chip assembly structure according to the embodiments of the present disclosure have following advantages. The package of the bridged multi-chip assembly structure enables heterogeneous chip integration with high bandwidth, low cost, and low stress around the bridge-chip joints. The cost for organic substrate (laminate) is lower than 2.1D technology, which requires a specially designed wiring on the organic laminate, and EMIB technology, which requires a specially designed silicon bridge embedded laminate. Also, the use of the bridge chip 120 reduces costs relative to 2.5D and 2.3D technologies, which require silicon and organic interposers, respectively. Note that a small bridge chip is generally cheaper than the high-density laminate and the silicon interposer. Also, the present disclosure enables reducing the number of times expensive flip chip bonding processes are performed, and this process may be required only for the bridge chip bonding. The method according to the embodiments requires the performance of only one C4 soldering onto the organic substrate compared to the EMIB where flip-chip bonding to the organic substrate is required as many times as the number of chips to be arranged. Furthermore, the stress generated at the assembly may be lower than 2.3D technology and EMIB technology. Additionally, the bridged multi-chip assembly structure according to embodiments of the present disclosure may be suitable for higher density interconnections relative to a fanout wafer level packaging process, which requires an organic re-distribution layer over a fan-outed chip surface.

Note that the mechanical stress during the fabrication process due to the CTE difference between the chip and the organic substrate is relieved since: (i) the plurality of chips 100 has been rigidly fixed to each other by the extension part 110 (especially the gap part 110G) of the molding material; and (ii) the bridge chip 120 has been bonded to such rigidly fixed chips 100. Displacement between the bridged chips 100 when connecting to the organic substrate 140 due to the CTE difference can thus be prevented. This can prevent a failure and degradation of the yield of the packaging products.

Because the molding material rigidly fixes the plurality of chips, a thinner bridge chip is enabled, thereby further reducing the laminate cost. The exposed back surfaces of the chips provide further suitable structure for future high-end modules consisting of many chiplets.

Although the advantages obtained with respect to the one or more specific embodiments according to the present disclosure have been described, it should be understood that some embodiments may not have these potential advantages, and these potential advantages are not necessarily required of all embodiments.

The terminology used herein is for the purpose of describing particular embodiments only and is not intended to limit the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present disclosure has been presented for purposes of illustration and description but is not intended to be exhaustive or limited to the disclosure in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bridged multi-chip assembly structure, comprising:
   providing a carrier substrate;
   arranging a plurality of chips on the carrier substrate in a predetermined layout, each chip having a front surface including a set of terminals formed thereon, wherein the front surface of each chip of the plurality of chips includes a set of bumps for connecting to an organic substrate, wherein the carrier substrate includes an array of micro-pads on which each chip is to be arranged, and wherein arranging the plurality of chips comprises temporarily fixing the set of bumps and the array of micro-pads;
   depositing a molding material between the plurality of chips and on the carrier substrate;
   removing the carrier substrate from the plurality of chips fixed by the molding material, removing the carrier substrate from the plurality of chips comprises debonding the array of micro-pads from the set of bumps; and bonding a bridge chip to corresponding sets of terminals of at least two chips of the plurality of chips fixed by the molding material.

2. The method of claim 1, wherein:
the plurality of chips is arranged on the carrier substrate such that the front surface of each chip faces the carrier substrate, and
providing the carrier substrate comprises:
applying a resin material on the carrier substrate; and
patterning the resin material to provide a space in which the set of bumps of each chip is accommodated when arranging the plurality of chips and depositing the molding material.

3. The method of claim 1, wherein a part of the molding material fixing the at least two chips of the plurality of chips has a surface that is flush with the front surfaces of the at least two chips of the plurality of chips.

4. The method of claim 1, wherein:
a distance between a back surface of the bridge chip and a plane of the front surfaces of the plurality of chips is less than a height of the bumps.

5. The method of claim 1, wherein placing the bridge chip comprises:
forming joints between the at least two chips of the plurality of chips and the bridge chip via the corresponding sets of terminals; and
applying an underfill material around at least positions corresponding to the joints between the bridge chip and the at least two chips of the plurality of chips.

6. The method of claim 1, wherein depositing the molding material comprises:
depositing the molding material into at least a gap between the plurality of chips such that a back surface of each chip is exposed.

7. The method of claim 1, wherein depositing the molding material comprises:
depositing the molding material between and over the plurality of chips; and
thinning at least the molding material from a back side of the plurality of chips such that a pre-molded multi-chip structure containing the plurality of chips and a part of the molding material has a uniform thickness.

8. The method of claim 1, wherein:
the carrier substrate has a wafer form,
depositing the molding material results in a wafer shaped structure containing the plurality of chips and a part of the molding material, and
the method further comprises dicing the wafer shaped structure to obtain a piece of a bridged multi-chip assembly.

9. The method of claim 1, further comprising:
bonding the plurality of chips having the bridge chip to an organic substrate; and
encapsulating the bridge chip and joints between the plurality of chips and the organic substrate by an encapsulation material.

10. The method of claim 1, wherein the set of bumps for each chip forms a two-dimensional array with one or more notch areas where the corresponding bridge chip are overlapped.

11. The method of claim 1, the bumps are Controlled Collapse Chip Connection (C4) solder bumps.

12. A method of fabricating a multi-chip assembly structure, comprising:
providing a carrier substrate;
arranging a plurality of chips on the carrier substrate, wherein each chip has a front surface including a set of terminals formed thereon and a set of bumps for connecting to an organic substrate, wherein each chip has a back surface opposite the front surface, wherein the chips of the plurality of chips have a substantially uniform chip thickness between respective front surfaces and back surfaces, wherein the carrier substrate includes an array of micro-pads on which each chip is to be arranged, and wherein arranging the plurality of chips comprises temporarily fixing the set of bumps and the array of micro-pads;
placing a mold in close contact with the back surfaces of the plurality of chips;
depositing a molding material such that the molding material is in contact with the mold, between the plurality of chips, and on the carrier substrate; and
removing the carrier substrate from the plurality of chips fixed by the molding material, wherein removing the carrier substrate from the plurality of chips comprises debonding the array of micro-pads from the set of bumps.

13. The method of claim 12, further comprising:
bonding a bridge chip to corresponding sets of terminals of at least two chips of the plurality of chips fixed by the molding material.

14. The method of claim 12, wherein:
the plurality of chips is arranged on the carrier substrate such that the front surface of each chip faces the carrier substrate, and
providing the carrier substrate comprises:
applying a resin material on the carrier substrate; and
patterning the resin material to provide a space in which the set of bumps of each chip is accommodated when arranging the plurality of chips and depositing the molding material.

15. The method of claim 12, wherein a part of the molding material fixing the at least two chips of the plurality of chips has a surface that is flush with the front surfaces of the at least two chips of the plurality of chips.

16. The method of claim 12, wherein:
a distance between a back surface of the bridge chip and a plane of the front surfaces of the plurality of chips is less than a height of the bumps.

17. The method of claim 12, wherein placing the bridge chip comprises:
forming joints between the at least two chips of the plurality of chips and the bridge chip via the corresponding sets of terminals; and
applying an underfill material around at least positions corresponding to the joints between the bridge chip and the at least two chips of the plurality of chips.

18. The method of claim 12, wherein:
the carrier substrate has a wafer form,
depositing the molding material results in a wafer shaped structure containing the plurality of chips and a part of the molding material, and
the method further comprises dicing the wafer shaped structure to obtain a piece of a bridged multi-chip assembly.

19. The method of claim 12, further comprising:
bonding the plurality of chips having the bridge chip to an organic substrate; and
encapsulating the bridge chip and joints between the plurality of chips and the organic substrate by an encapsulation material.

20. The method of claim 12, wherein the set of bumps for each chip forms a two-dimensional array with one or more notch areas where the corresponding bridge chip are overlapped.

21. The method of claim 12, the bumps are Controlled Collapse Chip Connection (C4) solder bumps.

22. A method of fabricating a multi-chip assembly structure, comprising:
providing a carrier substrate;
arranging a plurality of chips on the carrier substrate, wherein each chip has a front surface including a set of terminals formed thereon, wherein each chip has a back surface opposite the front surface, and wherein the chips of the plurality of chips have different chip thicknesses between respective front surfaces and back surfaces;
arranging a mold spaced apart from the back surfaces of the plurality of chips;
depositing a molding material such that the molding material is in contact with the mold, between the plurality of chips, and on the carrier substrate;
removing the carrier substrate from the plurality of chips fixed by the molding material; and
removing molding material to expose the back surface of at least one chip of the plurality of chips.

23. The method of claim 22, further comprising:
forming sets of bumps, for connecting to an organic substrate, on the front surfaces of the plurality of chips fixed by the molding material.

24. A method of fabricating a multi-chip assembly structure, comprising:
providing a carrier substrate having a surface, the carrier substrate including a release layer arranged in direct contact with the surface and including a patterned layer arranged in direct contact with the release layer;
arranging a plurality of chips on the layer of the carrier substrate, each chip having a front surface including a set of terminals formed thereon, wherein the front surface of each chip of the plurality of chips includes a set of bumps for connecting to an organic substrate, wherein the carrier substrate includes an array of micro-pads on which each chip is to be arranged, and wherein arranging the plurality of chips comprises temporarily fixing the set of bumps and the array of micro-pads;
depositing a molding material between the plurality of chips and on the patterned layer of the carrier substrate; and
removing the carrier substrate and the release layer from the plurality of chips fixed by the molding material, wherein removing the carrier substrate from the plurality of chips comprises debonding the array of micro-pads from the set of bumps.

25. The method of claim 24, wherein the removing the carrier substrate and the release layer includes releasing the contact between the release layer and the patterned layer.

* * * * *